(12) United States Patent
Hirokawa et al.

(10) Patent No.: US 6,595,831 B1
(45) Date of Patent: Jul. 22, 2003

(54) METHOD FOR POLISHING WORKPIECES USING FIXED ABRASIVES

(75) Inventors: Kazuto Hirokawa, Fujisawa (JP); Hirokuni Hiyama, Fujisawa (JP); Yutaka Wada, Fujisawa (JP); Hisanori Matsuo, Fujisawa (JP); Noburu Shimizu, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/560,562

(22) Filed: Apr. 28, 2000

Related U.S. Application Data

(63) Continuation-in-part of application No. 09/301,718, filed on Apr. 29, 1999, now Pat. No. 6,413,156.

(30) Foreign Application Priority Data

Feb. 10, 2000 (JP) .......................................... 2000-74910

(51) Int. Cl.$^7$ ................................................. B24B 1/00
(52) U.S. Cl. ............................ 451/36; 451/41; 451/50; 451/57; 451/58; 451/63
(58) Field of Search .............................. 451/36, 41, 56, 451/57, 58, 59, 63; 438/692, 693; 216/88, 89

(56) References Cited

U.S. PATENT DOCUMENTS

| | | | | |
|---|---|---|---|---|
| 5,514,245 A | * | 5/1996 | Doan et al. | 438/693 |
| 5,897,426 A | | 4/1999 | Somekh | |
| 6,227,950 B1 | * | 5/2001 | Hempel et al. | 451/288 |
| 6,250,994 B1 | * | 6/2001 | Chopra et al. | 451/288 |
| 6,309,282 B1 | * | 10/2001 | Wright et al. | 451/288 |
| 6,343,978 B1 | * | 2/2002 | Shimizu et al. | 451/287 |
| 6,413,156 B1 | | 7/2002 | Shimizu et al. | |
| 6,435,942 B1 | * | 8/2002 | Jin et al. | 451/8 |

FOREIGN PATENT DOCUMENTS

| | | |
|---|---|---|
| EP | 0 807 492 | 11/1997 |
| EP | 874 390 A1 | 10/1998 |
| JP | 6-42823 | 2/1989 |
| JP | 5-285807 | 11/1993 |
| WO | 99/26761 | 6/1999 |

OTHER PUBLICATIONS

U.S. application Ser. No. 09/446,764, filed Dec. 23,1999, "Abrading Plate and Polishing Method Using the Same (As Amended)".

* cited by examiner

*Primary Examiner*—Timothy V. Eley
(74) *Attorney, Agent, or Firm*—Wenderoth, Lind & Ponack, L.L.P.

(57) ABSTRACT

A polishing method and apparatus can concurrently establish a stable removal rate, a small step height reduction rate, and reduction of detects on the polished surface for various kinds of polished subjects, while providing less environmental problems and requiring less processing costs. The method for polishing a surface of a semiconductor device wafer comprises first polishing a surface of the semiconductor wafer by a first fixed abrasive polishing method; and finish polishing the polished surface of the semiconductor wafer by a second fixed abrasive polishing method different from the first fixed abrasive polishing method.

24 Claims, 24 Drawing Sheets

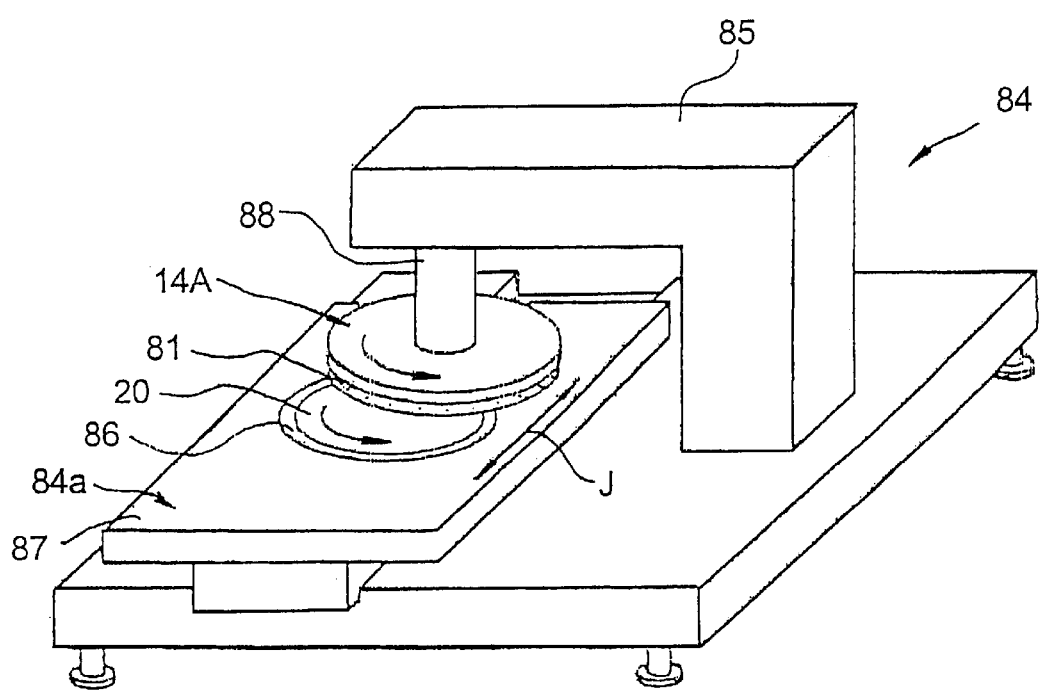
F I G.19

F I G. 21
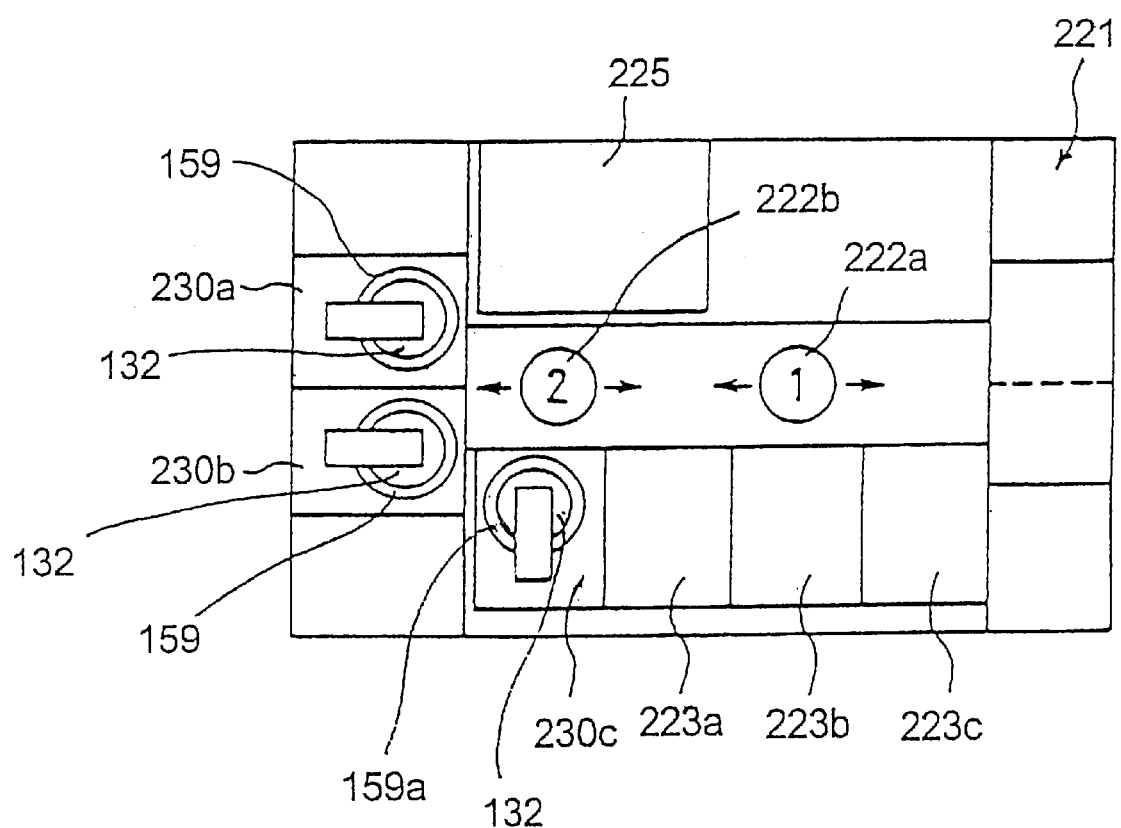

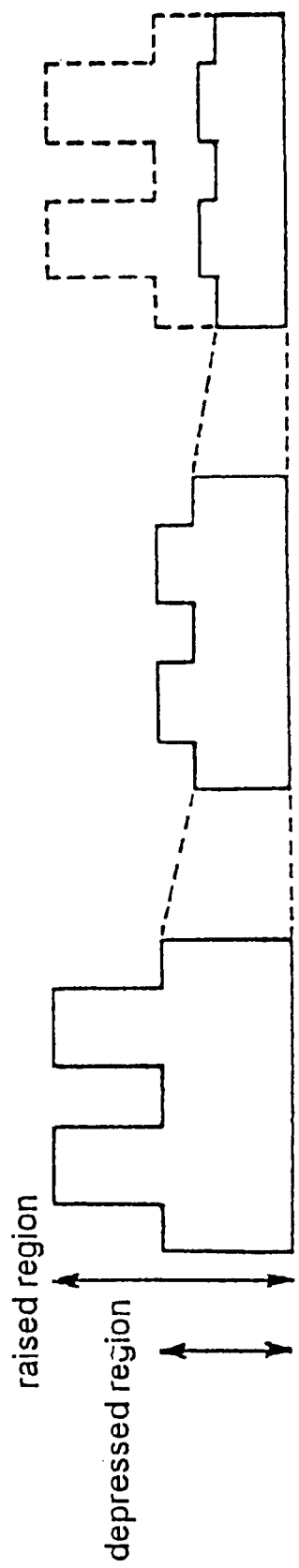

METHOD FOR POLISHING WORKPIECES USING FIXED ABRASIVES

This is a continuation-in-part of application Ser. No. 09/301,718, filed Apr. 29, 1999 now U.S. Pat. No. 6,413,156.

BACKGROUND OF THE INVENTION

1. Field of the Invention

The present invention relates in general to methods and apparatuses for polishing workpieces such as semiconductor wafers, and relates in particular to a polishing apparatus for processing a surface of a so-called "device wafer" including various elements, wiring patterns, or patterned irregularities formed thereon, into a flat mirror surface.

2. Description of the Related Art

In recent years, the integration density of semiconductor devices has become progressively higher, which leads to finer interconnecting wirings and smaller integrated devices. In a manufacturing process for such semiconductor wafers, it is sometimes necessary to provide a step for removing films formed on a device wafer surface by polishing to planarize the surface.

Such process is necessary in the following cases:
(1) In a case of polishing a wafer having multi-layered circuits,
  i) materials such as $SiO_2$, SiOF, and CF for planarizing inter-layer films are polished,
  ii) W, Al or Cu is polished after embedding plugs, or
  iii) Al or Cu is polished after embedding wirings.
(2) In a case of manufacturing MOSFET (Metal Oxide Semiconductor Field Effect Transistor),
  i) polycrystalline Si is polished after forming shallow trenches, or
  ii) $SiO_2$ is polished after forming various electrodes.

One of the available planarization methods is a chemical-mechanical polishing (CMP) process using an apparatus as shown in FIG. 22. The polishing apparatus comprises a turntable 9 having a polishing cloth (pad) 3, and a top ring assembly 10. The top ring assembly 10 comprises a top ring 13 for holding a semiconductor wafer 20, a top ring shaft 48 for providing the top ring 13 with rotational forces and pressing forces, and a ball 47 forming a universal joint for tiltably coupling the top ring 13 to the top ring shaft 48. The top ring 13 comprises an elastic mat 42 at a bottom surface to hold the wafer 20 through the mat 42. The top ring 13 has a cylindrical retainer ring 16 on its outer periphery to hold the wafer 20 so that the wafer 20 does not disengage from the bottom surface of the top ring 13 while polishing.

By such construction, the wafer surface is polished into a mirror surface while the wafer 20 is between the turntable 9 and the top ring 13; a certain pressure is applied by the top ring assembly 10 between the wafer 20 and polishing cloth 3; the turntable 9 and the top ring 13 are respectively rotated; and a polishing solution (slurry) Q including abrasive particles is supplied to the top surface of the polishing cloth 3.

One of the problems of the conventional chemical mechanical polishing (CMP) process is that, during the initial stage of polishing the device wafer having patterned irregularities, raised regions of the surface structure are preferentially removed, but depressed regions are also gradually removed. Therefore, irregularities of the surface are difficult to eliminate. This is because the combined use of the relatively soft cloth and the slurry solution containing abundant free abrasive particles applies chemical mechanical polishing effects not only to the raised regions but also to the depressed regions of the semiconductor surface structure. FIG. 23 illustrates such problems of the conventional CMP; showing irregularities caused by a raised region and depressed region of a surface film on the vertical axis, and relative time on the horizontal axis. This graph shows that, after a relative polishing time of 1, the raised regions are polished from a thickness of about 27,000 angstroms to 16,000 angstroms, and the depressed regions are also polished from 20,000 angstroms to 16,000 angstroms, and thus the irregularities are eliminated. FIG. 24A shows surface profiles in an initial stage, FIG. 24B in a middle stage, and FIG. 24C in a final stage of polishing. As illustrated in these drawings, irregularities are very difficult to be removed, that is, step height reduction rate is small, and consequently, such polishing is a time-consuming operation.

Another problem relates to "a pattern dependency" of polishing due to a combination of the relatively soft polishing cloth and the slurry containing abundant abrasive particles. The pattern dependency is a difficulty in obtaining a completely flat surface, resulting from an already existing unevenness pattern on the unpolished surface. This is caused by the polish rate difference between the coexisting fine and coarse irregularities on the polished surface. The locations with fine irregularities are polished at a higher rate than the locations with coarse irregularities, thus resulting in a large-scale surface unevenness on the polished workpiece surface.

Also, an "edge wear" problem may occur, in which an outer periphery (edge) is more intensively polished than the inner region of the workpiece surface, because the polished workpiece is plunged into the elastic polishing cloth.

Another problem is that the polished workpiece is shaped like a dish due to selective polishing of the edge portions. This is caused by uneven distribution of the polishing solution supplied between the polishing cloth and workpiece from the outside to the central region, resulting in that the central region of the polished surface is supplied with a smaller amount of abrasive particles.

Furthermore, as described above, this method consumes a large quantity of suspension (slurry) including abundant expensive abrasive particles, so that environmental problems and a processing cost are also large.

Thus, a method has been developed, which uses a so-called fixed abrasive polishing tool (such as an abrading plate) which comprises cerium-oxide ($CeO_2$) or other abrasive particles bound in a binder comprised of phenol resin, etc. This method uses an abrading plate harder than the conventional polishing cloth, which allows to preferentially polish the raised portions of the uneven surface, while leaving the depressed portions unpolished. Consequently, thus, absolute flatness of the polished surface can be obtained easily. Furthermore, the fixed abrasive polishing tool can provide a self-stopping function, depending on its composition, in which the polishing rate is remarkably lowered when the surface becomes flat after being rid of the irregularities. Thus, it can automatically stop further substantial polishing to avoid excessive polishing. Also, since it is not necessary to use a suspension (slurry) containing a large amount of abrasive particles, the environmental problems and processing cost can be lowered.

However, polishing using a fixed abrasive polishing tool has the following problems. That is, although a flat surface without scratches is necessary to produce a wafer suitable for producing devices thereon, the use of the hard tools causes the creation of many scratches on the polished surface of the workpiece while providing a highly flat surface.

Therefore, conventional fixed abrasive polishing tools for polishing the semiconductor wafers were allowed to have a limited choice of binder materials, and have been used in a narrowly balanced composition range of the abrasive particles, the binder and porosity. However, the device wafers to be polished comprise patterns of various materials such as: a silicon substrate, polycrystalline silicon films, oxide films, nitride films, and wiring layers comprised of aluminum or copper. Thus, it has been practically difficult to prepare various fixed abrasive polishing tools corresponding to the various polished subjects for preventing scratches while obtaining a stable removal rate with a small step height reduction rate.

SUMMARY OF THE INVENTION

It is an object of the present invention to provide a polishing method and apparatus capable of concurrently establishing a stable removal rate, a small step height reduction rate, and a reduction of defects on the polished surface for various kinds of polished subjects, while providing fewer environmental problems and requiring lower processing costs.

Such problems are solved by a method for polishing a surface of a semiconductor device wafer comprising: first polishing a surface of the semiconductor wafer by a first fixed abrasive polishing method; and finish polishing the polished surface of the semiconductor wafer by a second fixed abrasive polishing method different from the first fixed abrasive polishing method. The device wafers have been already explained in the description of the back ground of the invention. In a first polishing process using a first fixed abrasive polishing method, the wafer is processed to have a certain film thickness removed and a high flatness surface is realized. And in a finish process using a second fixed abrasive polishing method, a further thickness adjustment and/or scratch elimination is conducted while maintaining the high flatness, thereby realizing a high quality processing. It is not necessary to perform each of the first and finish processes by a single step process. One or both processes may be comprised of plural steps using one or plural apparatuses. Additional steps may be applied before and/or after those processes.

With the planarization method according to the present invention, it is basically not necessary to supply a slurry including free abrasive particles, and thus a polishing solution without abrasive particles is sufficient. Thus, it has the advantages of fewer environmental problems in waste liquid processing, and a lower cost load from consumable supplies such as slurries. Abrasive particles are directly supplied from the polishing surface of the fixed abrasive polishing tool, to thereby present a uniform abrasive particle distribution on the wafer surface to be polished, thus allowing the provisions of a uniform and high quality processed surface. If abrasive particles should stay in the slurry for a longer period, secondary coagulation may create larger particles to cause scratching of a polished surface. However, this secondary coagulation will not happen in the process of the present invention, and thus a stable polishing process is realized.

In the past, it was commonly acknowledged that fixed abrasive polishing is not suitable for use in finish polishing for removing remaining scratches. This is because fixed abrasive polishing tools are generally hard, and abrasive particles are also harder than those used in non-fixed abrasive polishing methods. Needless to say, different polishing tools, or different conditions such as pressing pressures or sliding speeds should be applied corresponding to the purposes of each of the first and finish processes. That is, the first polishing process aims at obtaining an overall flat surface by preferentially removing the raised portions of the irregularities, and the finish process aims at removing fine scratches remaining on the flattened surface. The inventors have established the present invention in a process of trying to adapt the fixed abrasive polishing method to finish polishing by decreasing the factor of mechanical polishing in the chemical mechanical polishing (CMP).

The second fixed abrasive polishing method may use a second fixed abrasive polishing tool different from a first fixed abrasive polishing tool used in the first fixed abrasive polishing method. As described above, the first polishing process aims at obtaining a highly flat surface, and the finish process is for removing scratches. Such different purposes are well established by using different polishing tools suitable for the respective processes.

The second fixed abrasive polishing tool may be softer than the first fixed abrasive polishing tool. Or the second fixed abrasive polishing tool may have a lower elastic modulus than the first fixed abrasive polishing tool. A high quality surface polishing can be achieved by using, after the first polishing process, a second polishing tool having a lower elastic modulus (average compressive elastic modulus) than the first polishing tool. Here, scratches are effectively removed by a synergistic effect of the lower elastic modulus tool with the above described processing characteristics of the fixed abrasive polishing tool. A suitable hardness for the first fixed abrasive polishing tool is Vicker's Hardness of 10~70, and an elastic modulus of more than 500 kgf/cm$^2$ (4900 N/cm$^2$), preferably 500~50000 kgf/cm$^2$ (4900~490000 N/cm$^2$), and more preferably 1000~10000 kgf/cm$^2$ (9800~98000 N/cm$^2$). On the other hand, a suitable hardness for the second fixed abrasive polishing tool is, Shore's Hardness of 5~60, preferably 15~40, or an elastic modulus of less than 1000 kgf/cm$^2$ (9800 N/cm$^2$), preferably less than 700 kgf/cm$^2$ (6860 N/cm$^2$), and more preferably 100~600 kgf/cm$^2$ (980~5880 N/cm$^2$). Materials having a cellular, hollow or foamed structure are especially suitable for the second fixed abrasive polishing tool, such as a binder comprised of a foamed resin.

The reason for overlapping of the suitable ranges of elastic modulus for the first and second polishing tools is that the suitable hardness differs according to the characteristics of the film to be polished, especially its hardness. A harder fixed abrasive polishing tool is used when polishing oxide films, and a softer fixed abrasive polishing tool is used when polishing copper, in general. Anyway, the second fixed abrasive polishing tool should be softer than the first fixed abrasive polishing tool, in summary.

The second fixed abrasive polishing tool may comprise second abrasive particles having a lower hardness than first abrasive particles in the first fixed abrasive polishing tool. It is known that the softer abrasive particles have less tendency of creating scratches than the harder abrasive particles in general. Therefore, a small amount of polishing using the fixed abrasive polishing tool having softer abrasive particles can remove scratches created by harder abrasive particles, thereby producing a high quality polished surface.

The second fixed abrasive polishing tool may have a more intensive abrasive particle self-generation ability than the first fixed abrasive polishing tool. A polishing tool having a greater ability can constantly have active abrasive particles exposed on its polishing surface, thereby enabling stable polishing. This is because, the number of abrasive particles contributable to the processing is large, the abrasive particles effective for processing are distributed uniformly on the polished surface, and the processing force load on each abrasive particle is minimized. Therefore, excessive abrasion by abrasive particles is prevented and a high grade polished surface with fewer scratches is produced. This effect of reducing the scratches is intensive when the particle size distribution is sharp, that is, has less variance. Furthermore, as the amount of self-generated abrasive particles is sufficient, it is not necessary to supply slurries from outside sources, thereby shortening the operation time.

Furthermore, in the conventional technologies, fixed abrasive polishing tools generally exhibit smaller self-generation effects as the abrasive particle size becomes finer, which prevented finer abrasive particles, advantageous for obtaining mirror polished surfaces, from being used. However, the method of the present invention has rendered it possible to obtain a mirror polished surface by using a fixed abrasive polishing method.

The second fixed abrasive polishing tool may comprise a higher porosity than the first fixed abrasive polishing tool. Fixed abrasive polishing tools are generally comprised of: abrasive particles for providing abrasive action; a polishing assistant effective or necessary for polishing; a binder for fixing those materials, and pores. By increasing the porosity among those compositions, abrasive particles are loosely bonded and easily self-generated. Thus, such a second fixed abrasive polishing tool comprising a higher porosity than the first fixed abrasive polishing tool has a higher self-generation effect, enabling the formation of a mirror polished surface.

The second fixed abrasive polishing tool may have a lower binder ratio than the first fixed abrasive polishing tool. By decreasing the binder ratio among the compositions, abrasive particles are loosely bonded and easily self-generated. Thus, the second fixed abrasive polishing tool having a lower binder ratio than the first fixed abrasive polishing tool has a higher self-generation effect, enabling a mirror polished surface to be provided.

The second fixed abrasive polishing tool may comprise a water soluble binder. When polishing by using such a polishing tool, the soluble binder dissolves into the supplied solutions such as purified water, a chemical agent or a slurry. This decreases binding grade for the abrasive particles in the tool to increase the amount of self-generated abrasive particles. This fixed abrasive polishing tool allows polishing in which the freed abrasive particles dominantly work over the as-fixed abrasive particles, without necessity of supplying a slurry from the exterior. Thus, a scratch-less surface can be obtained while maintaining a high flatness produced by the first fixed abrasive polishing tool. This second polishing tool also provides an advantage in that voids are formed on the polishing surface of the tool at the locations where the water soluble binder has dissolved, which serve to trap or hold foreign matter that is potentially detrimental to polishing, thereby preventing the creation of scratches.

The second fixed abrasive polishing tool may comprise second abrasive particles having a smaller diameter than first abrasive particles in the first fixed abrasive polishing tool. It is known that fixed abrasive polishing tools having smaller diameter abrasive particles are effective to reduce scratches. The reason is that the larger diameter particles are stuck in the worked surface while polishing. When having the same composition, the finer the abrasive particles are, the more the number of particles per unit volume of polishing tool is. Thus, effective particles are uniformly distributed on the worked surface for averaging and reducing the working force load on one abrasive particle. Thus, excessive work on the abrasive particles is suppressed and a high quality polishing with fewer scratches can be obtained. Furthermore, smaller abrasive particles have a larger specific surface area so as to provide a large amount of surface activity. Thus, polishing action based on the chemical reaction between the abrasive particles and the wafer is enhanced to improve finished surface flatness. Here, the narrower the particle size distribution, the more scratch elimination.

The second fixed abrasive polishing tool may additionally comprise elastic micro-particles embedded in the binder. By including such elastic micro-particles in the tool, the working force load on the worked surface from the abrasive particles is reduced, thus producing a high quality polished surface without micro-sized scratches.

The second fixed abrasive polishing tool may comprise a laminated configuration including an upper hard tool layer and a lower elastic layer. This underlying elastic layer beneath the hard tool layer gives the fixed abrasive polishing tool some elasticity for conforming to the worked surface of the wafer. Thus, the whole surface of the fixed abrasive polishing tool may contact the wafer, so that a uniform working pressure allows a scratch-less polished surface to be obtained. Since the surface layer is hard, the wafer does not plunge into the tool to the extent to degrade the height reduction rate.

The second fixed abrasive polishing method is preferably performed in a second condition different from a first condition in the first fixed abrasive polishing method. The first condition is aimed at obtaining a high flatness, and the second is to obtain a scratch-less surface by applying a lower working pressure, a higher relative speed, and a higher and sufficient amount of solution or chemical agent supply and so on. Thus, the method can produce a highly flat and scratch-less polished surface.

For example, it is preferable to, from the start of or in the mid-stage of the finish polishing process, load a lower working pressure than the first polishing process, and/or raise the relative speed between the wafer and the polishing tool, and/or increase the supply of polishing solution. Reducing the working pressure or raising the relative speed induces the generation of hydrodynamic forces at the sliding interface to thereby reduce the direct contact area between the polishing tool and the wafer. This moderates the working force vertically acting on the worked surface from the abrasive particles so as to provide scratch-less polishing. A sufficient supply of polishing solution facilitates the diffusion of ineffective fragments of abrasive particles, binders, or generated shavings into the solution and prohibits their deposition. The fragments are easily discharged because of the abundance of the supply of polishing solution, thereby preventing the generation of scratches.

The second fixed abrasive polishing method may use a second polishing solution different from a first polishing solution used in the first fixed abrasive polishing method. It is preferable to finish polish the wafer with a second fixed abrasive polishing tool while supplying purified water, after obtaining a highly flat surface by using a first fixed abrasive polishing tool while supplying solutions other than water. Here, hydration caused by OH radicals included in the purified water is applied to the worked surface in addition to the chemical action performed by the abrasive particles. Thus, a scratch-less worked surface can be produced after slightly polishing the surface using the second polishing tool, while maintaining the high flatness obtained by the first polishing tool.

In the finish polishing process using chemical agents, not only hydration, but other various chemical reactions are additionally applicable. Especially by supplying an agent for raising the viscosity of a liquid film formed between the fixed abrasive polishing tool and the wafer, abrasive particles moderately act on the worked surface to thereby reduce scratches. By supplying a slurry including abrasive particles, the polishing rate can be raised to shorten the processing time. Examples for agents to be supplied when polishing silicon or polycrystalline silicon films are: organic amines as a process acceleration agent, inorganic salts having pH buffering effects as a process performance stabilizing agent, organic macro molecules such as surfactants or the like as a mirror surfacing agent, and IPA (isopropyl alcohol) as a cleaning promotion agent.

Dressing of the polishing tool may be performed concurrently with polishing in the first polishing process and/or the finish polishing process. Dressing or reconditioning effects are not provided for the fixed abrasive polishing tool when processing a wafer after establishing a highly flat surface thereon. This is because the wafer surface has no remaining irregularities working for dressing the polishing tool, and the abrasive particle self-generation ability of the tool is lowered. An in-situ dressing (dressing concurrently performed with polishing) can forcibly activate the polishing surface of the tool so as to expose the unused abrasive particles on the polishing surface as if it is vigorously self-generating the abrasive particles. Thus, the finish process can produce a scratch-less polished surface after slightly removing the surface to reach a target thickness, while stably polishing by maintaining a high flatness produced by the first fixed abrasive polishing tool.

Furthermore, by dressing the tool, abrasive particles are promptly released so that a large amount thereof act on the polished surface. Thus, a sufficient number of substantially effective abrasive particles are supplied per unit polished surface area so that the pressing force applied by one abrasive particle is lowered so as to moderately act on the worked surface. When the abrasive particles are fine, it is preferable to add a dispersing agent such as a surfactant for facilitating the abrasive particles dispersed into the polishing solution.

It is preferable to clean the device wafer between the first polishing process and the finish polishing process. Foreign matter generated in the first polishing process, such as fragments of abrasive particles, binders or additives, or used or reacted chemical agents, may remain on the polished surface, which may cause some damage to the finished surface. By cleaning the wafer before the finish process, such damage can be prevented to provide a high quality polishing.

The first polishing process and the finish polishing process may be performed by using the same fixed abrasive polishing tool in different polishing conditions. A hard type polishing tool comprising fine abrasive particles, which are necessary for the finish polishing, is chosen as the same fixed abrasive polishing tool. The conditions for the finish polishing in comparison to the first process includes: lower working pressures, higher relative speeds, higher and sufficient supply of solution or chemical agent, and so on, that can prevent scratching. By adopting such conditions, a highly flat surface without scratches can be produced.

The first polishing process and the finish polishing process may be performed by using the same fixed abrasive polishing tool and different polishing solutions. A hard type polishing tool comprising fine abrasive particles, which are necessary for the finish polishing, is chosen as the same fixed abrasive polishing tool. It is preferable to finish polish the wafer by supplying purified water, after obtaining a highly flat surface by using a first fixed abrasive polishing tool and solutions other than water. Here, hydration caused by OH radicals included in the purified water is applied to the worked surface in addition to the chemical action caused by the abrasive particles. Thus, a scratch-less worked surface can be produced, while maintaining the flat surface obtained by the first polishing tool, by performing slight polishing using the second polishing tool.

In the finish polishing process, various chemical reactions other than hydration are additionally applicable. Especially by supplying an agent for raising the viscosity of a liquid film formed between the fixed abrasive polishing tool and the wafer, abrasive particles moderately act on the worked surface for reducing scratches. When supplying a slurry including abrasive particles, the polishing rate can be raised to shorten the processing time. Examples for agents to be supplied when polishing silicon or polycrystalline silicon materials are: organic amines as a process acceleration agent, inorganic salts having pH buffering effects as a stabilizing agent, organic macro molecules such as a surfactant or the like as a mirror surfacing agent, and IPA (isopropyl alcohol) as a cleaning promotion agent.

The first polishing process and the finish polishing process may be performed by using the same fixed abrasive polishing tool, and dressing of the polishing tools may be performed concurrently with polishing. A hard type polishing tool comprising fine abrasive particles necessary for the finish polishing is chosen as the same fixed abrasive polishing tool. Dressing effects or reconditioning effects are not provided for the fixed abrasive polishing tool when processing a wafer after establishing a highly flat surface thereon. This is because the wafer surface has no remaining irregularities to work for dressing the polishing tool, thus lowering the abrasive particle self-generation ability of the tool. An in-situ dressing (dressing concurrently performed with polishing) can forcibly activate the polishing surface of the tool to expose the unused abrasive particles on the polishing surface as if it is vigorously self-generating the abrasive particles. Thus, the finish process can produce a scratch-less polished surface by slightly removing the surface to reach a target thickness, while maintaining a high flatness produced by the first fixed abrasive polishing tool and a stable polishing performance.

Furthermore, by dressing the tool, abrasive particles are promptly released so that a large amount thereof act on the polished surface. Thus, a sufficient number of substantially effective abrasive particles are supplied per unit area of the polished surface so that the pressing force applied by the abrasive particles is lowered to moderately act on the worked surface. When the abrasive particles are fine, it is preferable to add a dispersing agent such as a surfactant for dispersing the abrasive particles into the polishing solution.

When the first polishing process and the finish polishing process are performed by using the same fixed abrasive polishing tool, the device wafer may be cleaned between the first polishing process and the finish polishing process. A hard type polishing tool comprising fine abrasive particles, which are necessary for the finish polishing, is chosen as the same fixed abrasive polishing tool. Foreign matter generated in the first polishing process such as fragments of abrasive particles, binders, or additives, or used or reacted chemical agents, may remain on the polished surface of the wafer to cause some damage to the finished surface at the finish polishing process. By cleaning the wafer before the finish process, such damage can be prevented to thereby provide high quality polishing.

When the first polishing process and the finish polishing process may be performed by using the same fixed abrasive polishing tool, the polishing tool may be cleaned or dressed between the first polishing process and the finish polishing process. When using the same tool for the first and finish processes sequentially, polishing solution or polish shavings may remain on the polishing tool, which may cause some damage to the surface to be finished at the finish polishing process. By cleaning the polishing surface of the tool before the finish process to remove such fragments of abrasive particles, binders, or additives (chemical agent) or reacted substances, such damage can be prevented to thereby provide high quality polishing. The cleaning processes may comprise a physical cleaning method for forcibly cleaning the tool, such as cleaning the object in a liquid flow of dressing liquid or purified water, water jetting the object, applying an ultrasonic wave in a dressing liquid or purified water, and dressing with a tool such as a brush, a roller, or a diamond dressing tool. Other processes may include using chemical agents, or radiating energy beams such as ultraviolet rays.

Another aspect of the invention is a method for polishing a surface of a semiconductor device wafer comprising a first polishing process wherein polishing of the device wafer is performed mainly based on a mechanical polishing effect, and a finish polishing process wherein polishing of the device wafer is performed mainly based on a chemical polishing effect.

In a first process mainly based on a mechanical polishing effect, raised portions of the wafer are preferentially polished using a hard fixed abrasive polishing tool, for example, and a high flatness can be obtained on the wafer surface. By further finish polishing the wafer mainly based on a chemical polishing effect, scratches created in the first process are removed to establish a high quality polishing. The chemical polishing effect can be increased by, changing the chemical agent or its concentration, when using the same polishing tool for both first and finish processes, for example. Also, reactive particles may be increased by performing an in-situ (concurrent) dressing while polishing, or mechanical polishing effects may be suppressed by lowering the polishing pressure in the polishing.

Furthermore, when using different polishing tools for the first and finish processes, the following methods are available in addition to the aforementioned methods: adding some chemical agents in the fixed abrasive particles; or using second fixed abrasive polishing tools including abrasive particles of a smaller diameter than the first fixed abrasive polishing tool. Smaller diameter abrasive particles have a larger specific surface area so that they are constantly providing a higher surface activity. Thus, they can provide not only reduced mechanical polishing action but increased chemical polishing action, to thereby provide a high quality processing.

In another aspect of the present invention, an apparatus for polishing a surface of a semiconductor device wafer comprises: a first polishing unit comprising a first fixed abrasive polishing tool, and a finish polishing unit comprising a second fixed abrasive polishing tool different from the first fixed abrasive polishing tool. For example, the second fixed abrasive polishing tool is designed to have a smaller elastic modulus or to be softer than the first fixed abrasive polishing tool. Thus, scratches are effectively removed by a synergistic effect of the lower elastic modulus tool with the above described processing characteristics of the fixed abrasive polishing tool.

A wafer holding member of the finish polishing unit may comprise a wafer retaining ring to surround the wafer and to contact with a surface of the second fixed abrasive polishing tool when polishing. A fixed abrasive polishing tool of a high elastic modulus has less deformability due to its rigidity, and thus has the feature that it can polish the overall surface of the wafer, including the edge portion, flat. Therefore, the guide ring surrounding the outer periphery of the wafer is not required to have the function of pressing the polishing tool around the wafer. On the other hand, the fixed abrasive polishing tool used in the finish process preferably comprises a guide ring having a polishing surface planation function to thereby prevent the polish rate from increasing at the edge portion.

The first and/or second fixed abrasive polishing tool may comprise a turntable, a translational motion table or a cup-type fixed abrasive polishing tool. When using a fixed abrasive polishing tool, only the raised portions of the undulated device wafer surface are preferentially processed. Thus, it is not necessary to provide a constant relative speed between the polishing tool and the worked surface of the wafer, and various types of driving mechanisms or polishing tools can be adopted. One example of an application of the translational motion table is a second fixed abrasive polishing tool utilizing a scroll type table movement, which leads to compactness of the overall facility and advantages in apparatus cost for the clean room, or ease of maintenance.

Another aspect of the invention is a method for polishing a surface of a semiconductor device wafer comprising: first polishing a surface of the semiconductor wafer with a first polishing tool; and finish polishing the polished surface of the semiconductor wafer for removing scratches remaining on the surface of the device wafer with a fixed abrasive polishing tool. In the past, it has been commonly understood that using a fixed abrasive polishing tool for the finish process for removing the scratches is disadvantageous. The reason for this is considered to be that the fixed abrasive polishing tools are generally hard and include larger abrasive particles compared to the non-fixed abrasive a polishing tools.

According to the present invention, the main or first polishing process may be a CMP process using conventional pads, and a high quality polishing without scratching is possible by finish polishing using a finish fixed abrasive polishing tool. Another example is comprised of a first CMP process using a conventional pad, a second CMP process using another conventional pad, and a finish process using a finish fixed abrasive polishing tool. Another example is comprised of a first CMP process using a conventional pad, a second CMP process using a hard fixed abrasive polishing tool, and a finish process using a finish fixed abrasive polishing tool. By performing polishing using free abrasive particles prior to a fixed abrasive polishing process, an overall general planarization can be established. By further performing the fixed abrasive polishing process for planarization and/or finishing, it is not necessary to raise the polishing rate or polishing pressure so that a scratch-less fixed abrasive polishing can be realized. By finish polishing with a fixed abrasive polishing process, finish polishing is performed without degrading the flatness of the surface obtained in the previous process.

A further example may be comprised of a first CMP process using a fixed abrasive polishing tool, a second polishing process using a conventional pad, and a finish polishing process using a finish fixed abrasive polishing tool. Here, a first step aims at obtaining a high flatness, and the second step is to process the generated "sharp" scratches having edges of a small curvature into easy-to-remove ones having edges of a larger curvature. Thus, the final fixed abrasive polishing process can perform planarization as well as scratch elimination to thereby provide high quality processing.

The inventors have noticed that the fixed abrasive polishing process generally has a larger factor of mechanical polishing in a chemical mechanical polishing (CMP) process than the non-fixed abrasive polishing process. Thus, they made an effort to expand the chemical polishing factor in the CMP process in order to apply the fixed abrasive polishing to the finish polishing process, and have established the present invention. The inventors found that one of the significant parameters is a hardness of the polishing tool, and when the tool is soft, it can prevent or suppress the scratch creation. Suitable hardness for the finish fixed abrasive polishing tool is a Shore's Hardness of 5~60, preferably 15~40, or an elastic modulus of less than 1000 kgf /cm$^2$ (9800 N/cm$^2$), preferably less than 700 kgf/cm$^2$ (6860 N/cm$^2$), and more preferably 100~600 kgf/cm$^2$ (980~5880 N/cm$^2$). Materials having a foamed or cellular structure are especially suitable, and thus a binder comprised of a foamed resin is preferable.

BRIEF DESCRIPTION OF THE DRAWINGS

FIG. 19 is a perspective view of the polishing unit adapted to use the fixed abrasive polishing tool shown in FIGS. 18A to 18C;

FIG. 21 is a plan view of yet another embodiment of the polishing apparatus according to the present invention;

FIG. 24 is a diagram illustrating a process of polishing by the conventional polishing apparatus.

DETAILED DESCRIPTION OF THE PREFERRED EMBODIMENTS

Several embodiments of the present invention will be described below with reference to the attached drawings.

(1) Whole Construction of the Polishing Apparatus

Figure 1:
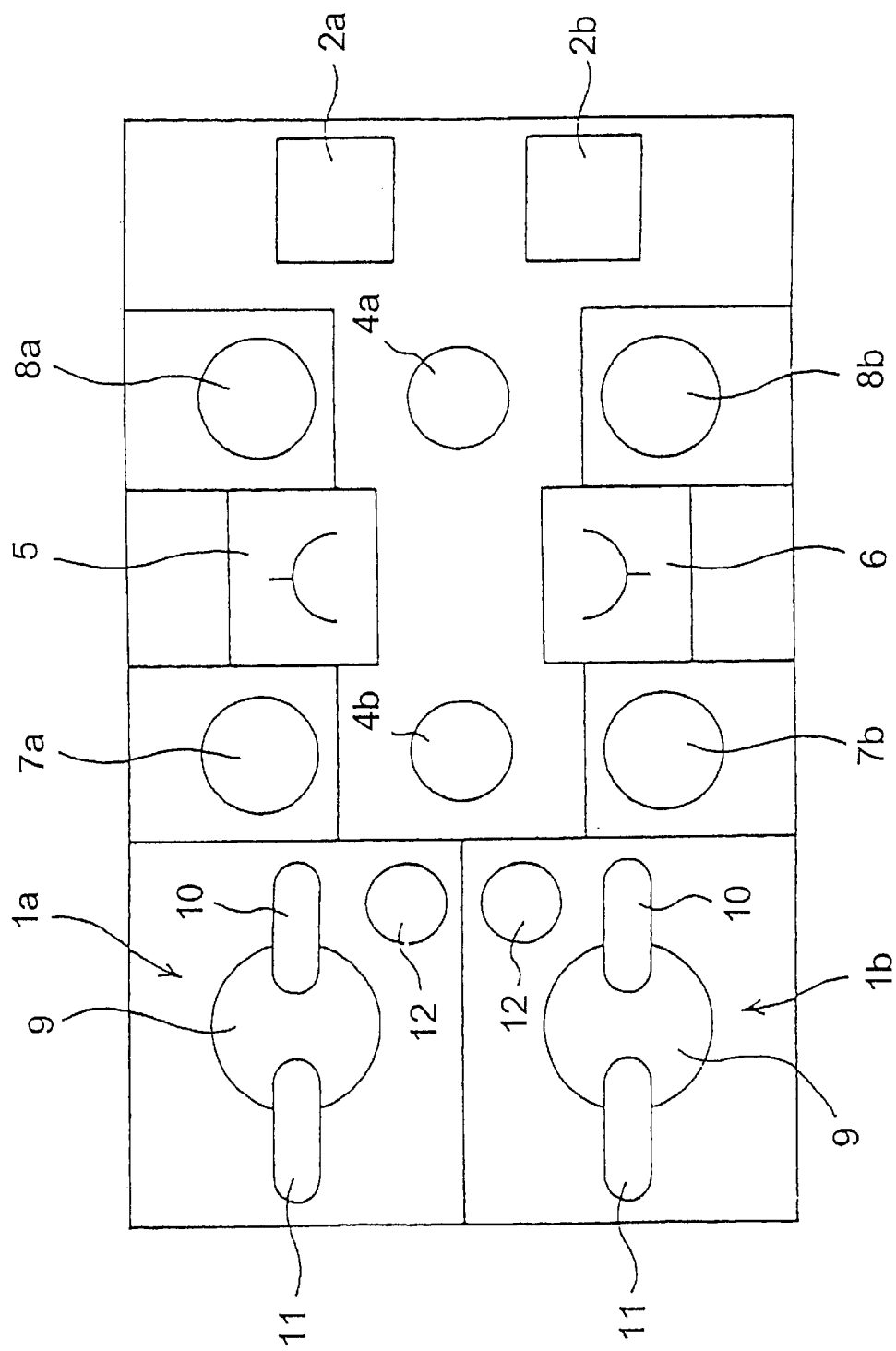
FIG. 1 is an overall plan view of the arrangement of the polishing apparatus according to the present invention.
Figure 2:
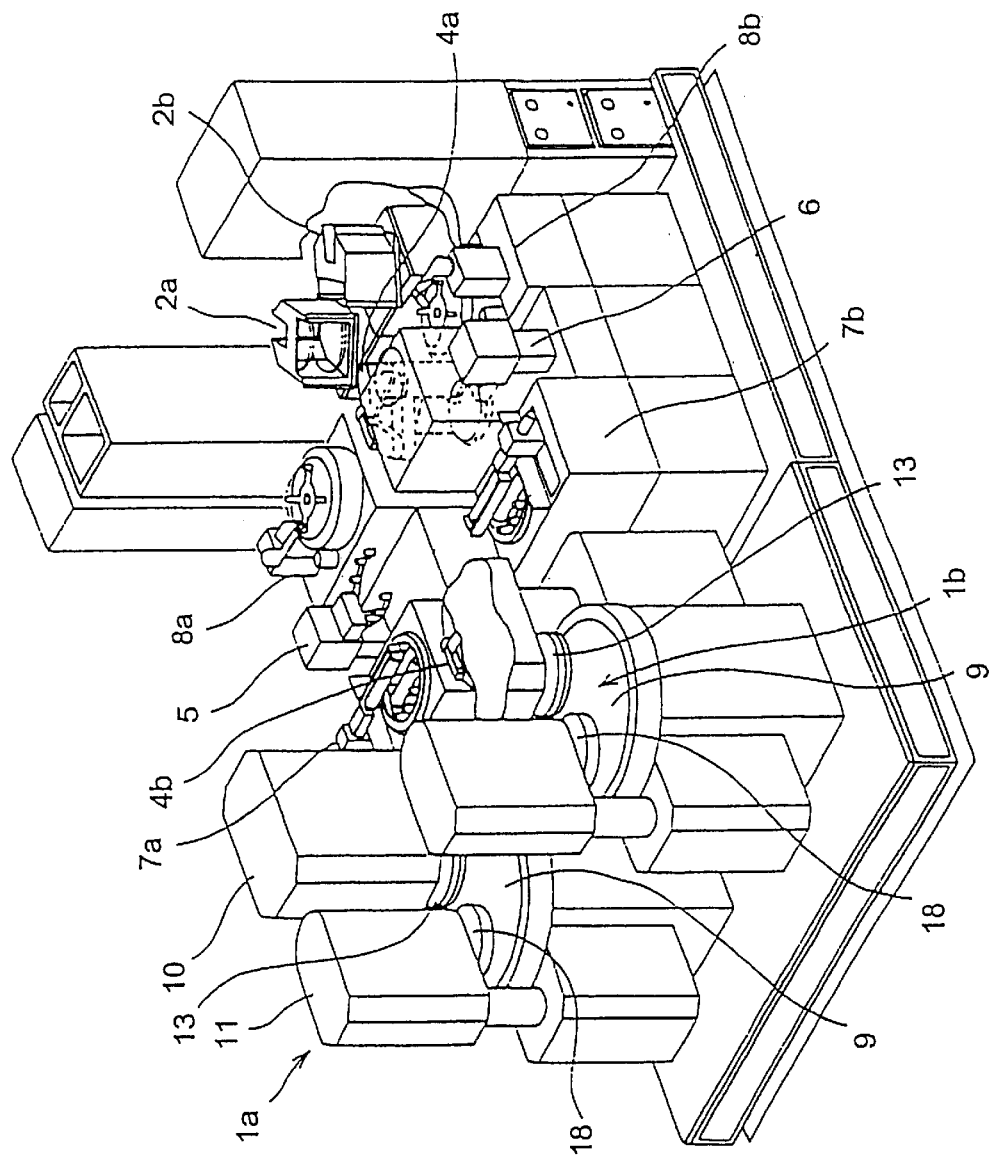
FIG. 2 is a perspective view showing the appearance of the polishing apparatus according to the present invention.

As shown in FIGS. 1 and 2, a polishing apparatus comprises a pair of polishing units 1a, 1b positioned at one end of a rectangular floor space and spaced from each other in confronting relation to each other, and a pair of loading/unloading units positioned at the other end of the rectangular floor space and having respective wafer storage cassettes 2a, 2b spaced from the polishing units 1a, 1b in confronting relation thereto. Two transfer robots 4a, 4b are provided on a transfer line which extends between the polishing units 1a, 1b and the loading/unloading units. The polishing apparatus also has a pair of reversing units 5, 6 disposed one on each side of the transfer line, and two pairs of cleaning units 7a, 7b and 8a, 8b disposed one pair on each side of the transfer line. The reversing unit 5 is positioned between the cleaning units 7a and 8a, and the reversing unit 6 is positioned between the cleaning units 7b and 8b. Each of the reversing units 5, 6 serves to turn a semiconductor wafer over.

Each of the polishing units 1a, 1b comprises: a turntable 9 having a polishing tool attached to an upper surface thereof; a top ring mechanism 10 for holding a semiconductor wafer under vacuum and pressing it against the polishing surface on the turntable 9, and a dressing mechanism 11 for dressing the fixed abrasive polishing tool. The polishing units 1a and 1b are of basically the same specifications, and are located symmetrically with respect to the transfer line.

Figure 3:
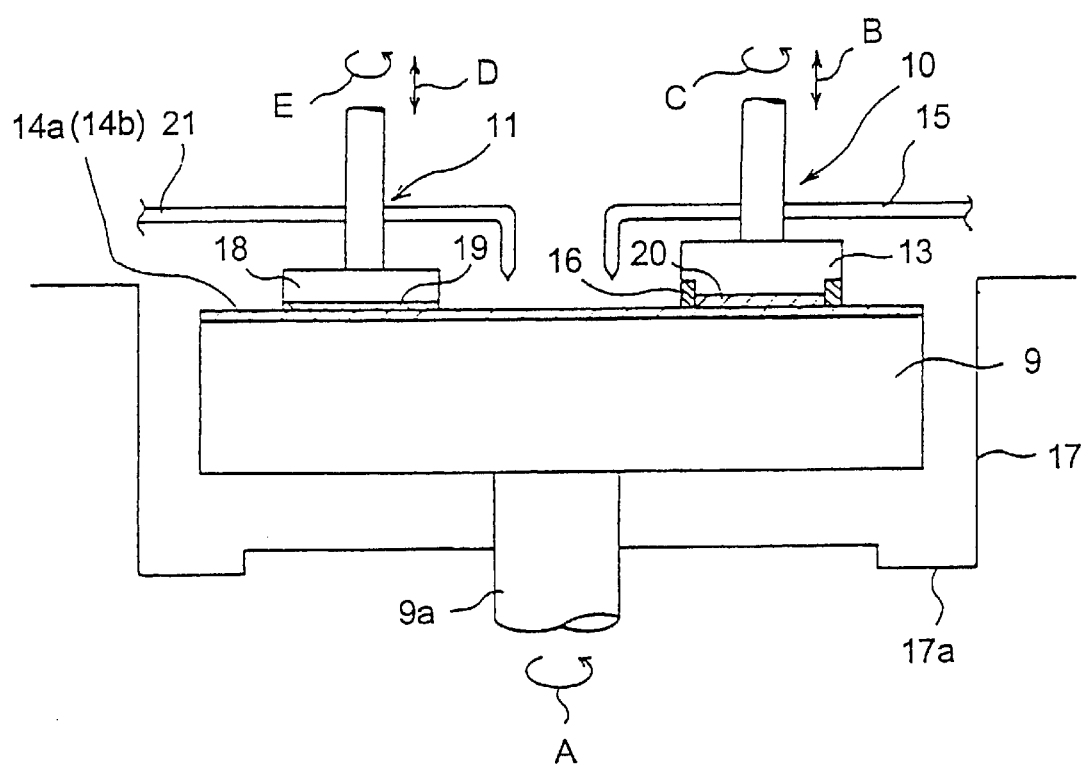
FIG. 3 is a cross sectional view showing the polishing unit illustrated in FIGS. 1 and 2 in detail.

FIG. 3 shows a detailed structure of the polishing unit 1a or 1b. As shown in FIG. 3, the top ring mechanism 10 has a top ring 13 positioned above the turntable 9 for holding a semiconductor wafer 20 and pressing it against the turntable 9. The top ring 13 is located in an off-center position with respect to the turntable 9. The turntable 9 is rotatable about its own axis as indicated by the arrow A by a motor (not shown) which is coupled through a shaft 9a to the turntable 9. Different fixed abrasive polishing tools are attached to the upper surface of each turntable 9 of respective polishing units, as described hereinafter.

The top ring 13 is coupled to a motor (not shown) and also to a lifting/lowering cylinder (not shown) to be vertically movable and rotatable about its own axis as indicated by the arrows B, C as well as capable of pressing the semiconductor wafer 20 against the fixed abrasive polishing tool 14a (14b) under a desired pressure. The semiconductor wafer 20 is attached to a lower surface of the top ring 13 under a vacuum or the like. A guide ring 16 is mounted on the outer circumferential edge of the lower surface of the top ring 13 for preventing the semiconductor wafer 20 from being disengaged from the top ring 13.

A polishing solution supply nozzle 15 is disposed above the turntable 9 for supplying a polishing solution onto the fixed abrasive polishing tool 14a (14b) attached to the turntable 9. A frame 17 is disposed around the turntable 9 for collecting the polishing solution and water which are discharged from the turntable 9. The frame 17 has a gutter 17a formed at a lower portion thereof for draining the collected polishing solution and water.

The dressing mechanism 11 has a dressing member 18 for dressing the fixed abrasive polishing tool 14a (14b). The dressing member 18 is positioned above the turntable 9 in diametrically opposite relation to the top ring 13. The tool 14a (14b) is supplied with a dressing liquid such as water from a dressing liquid supply nozzle 21 extending over the turntable 9. The dressing member 18 is coupled to a lifting/lowering cylinder (not shown) and to a motor (not shown) to be vertically movable as well as rotatable about its own axis as indicated by the arrows D, E.

The dressing member 18 is of a disk shape having almost the same diameter as the top ring 13 for holding a dressing element 19 on its lower surface. The lower surface of the dressing member 18 has holes (not shown) defined therein which may be connected to a vacuum source for holding the dressing element 19 under vacuum. The polishing solution supply nozzle 15 and the dressing liquid supply nozzle 21 respectively extend over the turntable closely to the rotation center thereof for supplying polishing solution and water respectively onto the fixed abrasive polishing tool 14a (14b) at predetermined locations.

As shown in FIG. 1, each of the polishing units 1a, 1b also has a pusher 12 positioned near the transfer line for transferring and receiving a semiconductor wafer 20 to and from the top ring 13. The top ring 13 is swingable in a horizontal plane, and the pusher 12 is vertically movable.

The cleaning units 7a, 7b and 8a, 8b may be of any desired types. For example, the cleaning units 7a, 7b positioned near the polishing units 1a, 1b may be of the type which scrubs both face and reverse sides of a semiconductor wafer with rollers having respective sponge layers. The cleaning units 8a, 8b positioned near the wafer storage cassettes 2a, 2b may be of the type which supplies a cleaning solution to the semiconductor wafer while holding the wafer at its edge and rotating it in a horizontal plane. Each of the cleaning units 8a, 8b also serves as a centrifugal dryer for dehydrating a semiconductor wafer under centrifugal forces. The semiconductor wafer is primarily cleaned at the cleaning units 7a, 7b, and is secondarily cleaned at the cleaning units 8a, 8b.

Each of the transfer robots 4a, 4b has an articulated arm foldable in a horizontal plane. The articulated arm has, on each of upper and lower portions thereof, two grippers for exclusively handling the dry and wet wafers respectively. The transfer robot 4a operates to cover a region ranging from the reversing units 5, 6 to the storage cassettes 2a, 2b, and the transfer robot 4b operates to cover a region ranging from the reversing units 5, 6 to the polishing units 1a, 1b.

Though the robots 4a, 4b are of a stationary type in this example, they may be of a transferable type that travels on rails.

The reversing units 5, 6 are necessary in the illustrated embodiment because of the storage cassettes 2a, 2b which store semiconductor wafers with their surfaces, which are to be polished or have been polished, facing upwardly. However, the reversing units 5, 6 may be dispensed with if semiconductor wafers are stored in the storage cassettes 2a, 2b with their surfaces to be polished or have been polished facing downwardly. Or, the transfer robots 4a, 4b may have a mechanism for reversing semiconductor wafers alternatively. In the illustrated embodiment, the reversing unit 5 exclusively serves to reverse a dry semiconductor wafer, and the reversing unit 6 exclusively serves to reverse a wet semiconductor wafer.

Figure 4:
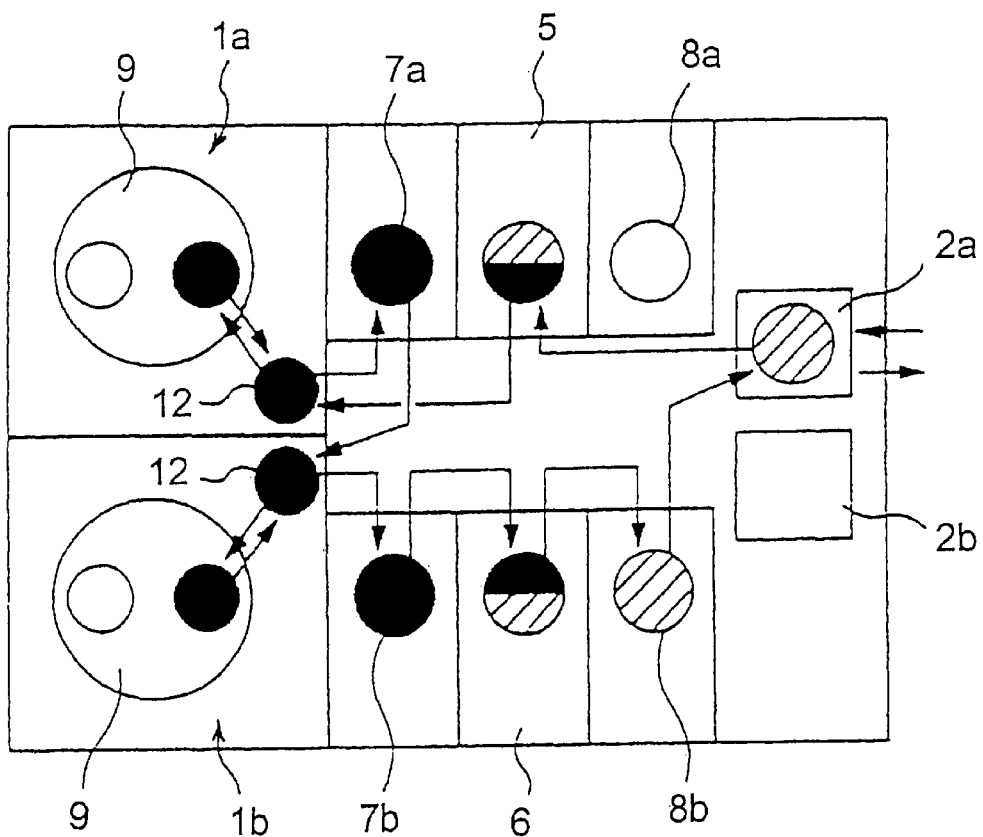
FIG. 4 is a diagram showing the operation of the polishing apparatus shown in FIGS. 1 to 3.

The polishing apparatus is operated selectively in a series mode of polishing operations shown in FIG. 4. This shows the states of the semiconductor wafers in respective positions. A shaded circle shows the position in which the semiconductor wafer surfaces to be polished or having been polished are facing upwardly. A solid circle shows the position in which the semiconductor wafer surfaces to be polished or having been polished are facing downwardly. An upper-half-shade and lower-half-solid circle shows the position in which the semiconductor wafer surfaces to be polished are reversed to face downwardly. And a lower-half-shade and upper-half-solid circle shows the position in which the semiconductor wafer surfaces having been polished are reversed to face upwardly.

In the two-stage polishing, three out of the four cleaning units 7a, 7b, 8b are operated to clean semiconductor wafers. As shown by solid lines, a semiconductor wafer is transferred from the storage cassette 2a to the reversing unit 5. The wafer is then transferred from the reversing unit 5 to the first polishing unit 1a after being reversed in the reversing unit 5. Then, the wafer is polished in the first polishing unit 1a and transferred to the cleaning unit 7a where it is cleaned. The cleaned wafer is then transferred from the cleaning unit 7a to the second polishing unit 1b where it is finish polished. The wafer is then transferred from the second polishing unit 1b to the cleaning unit 7b where it is cleaned. The cleaned wafer is then transferred from the cleaning unit 7b to the reversing unit 6 and is reversed, and transferred from the reversing unit 6 to the cleaning unit 8b. The wafer is then transferred from the cleaning unit 8b to the storage cassette 2a after being cleaned and dried in the cleaning unit 8b. The transfer robots 4a, 4b use the respective dry fingers when handling dry semiconductor wafers, and the respective wet fingers when handling wet semiconductor wafers. The pusher 12 of the polishing unit 1a receives the semiconductor wafer to be polished from the transfer robot 4b, is elevated and transfers the semiconductor wafer to the top ring 13 when the top ring 13 is positioned above the pusher 12. The semiconductor wafer which has been polished is rinsed by a rinsing liquid supplied from a rinsing liquid supply device which is provided at the pusher 12.

Since the semiconductor wafer is subjected to cleaning operations at the pusher 12 and in the cleaning unit 7a after being separated from the top ring 13, any polishing solution adhering to the polished surface, the rear surface, and side surface of the semiconductor wafer due to the primary polishing are completely removed. Then, the semiconductor wafer is subjected to a finish or secondary polishing operation in the polishing unit 1b, and then is cleaned in the cleaning units 7b, 8b. Thereafter, the polished and cleaned semiconductor wafer is subjected to centrifugal dehydration and returned to the storage cassette 2a. Polishing conditions of the primary polishing and secondary polishing are usually different from each other as described later.

In each of the polishing units 1a and 1b, the semiconductor wafer 20 is held on the lower surface of the top ring 13, and is pressed against the fixed abrasive polishing tool 14a (14b) on the upper surface of the turntable 9. The turntable 9 and the top ring 13 are rotated to bring the lower surface of the semiconductor wafer 20 in sliding contact with the fixed abrasive polishing tool 14a (14b). At this time, the polishing solution nozzle 15 supplies a polishing solution on the fixed abrasive polishing tool 14a (14b). The lower surface of the semiconductor wafer 20 is now polished by a combination of a mechanical polishing action of abrasive particles in the polishing tool or those released therefrom and a chemical polishing action of those particles and the polishing solution. The used polishing solution is flowed outwardly off the turntable 9 into the frame 17 under centrifugal forces caused by the rotation of the turntable 9, and is collected by the gutter 17a in the lower portion of the frame 17.

Figure 5:
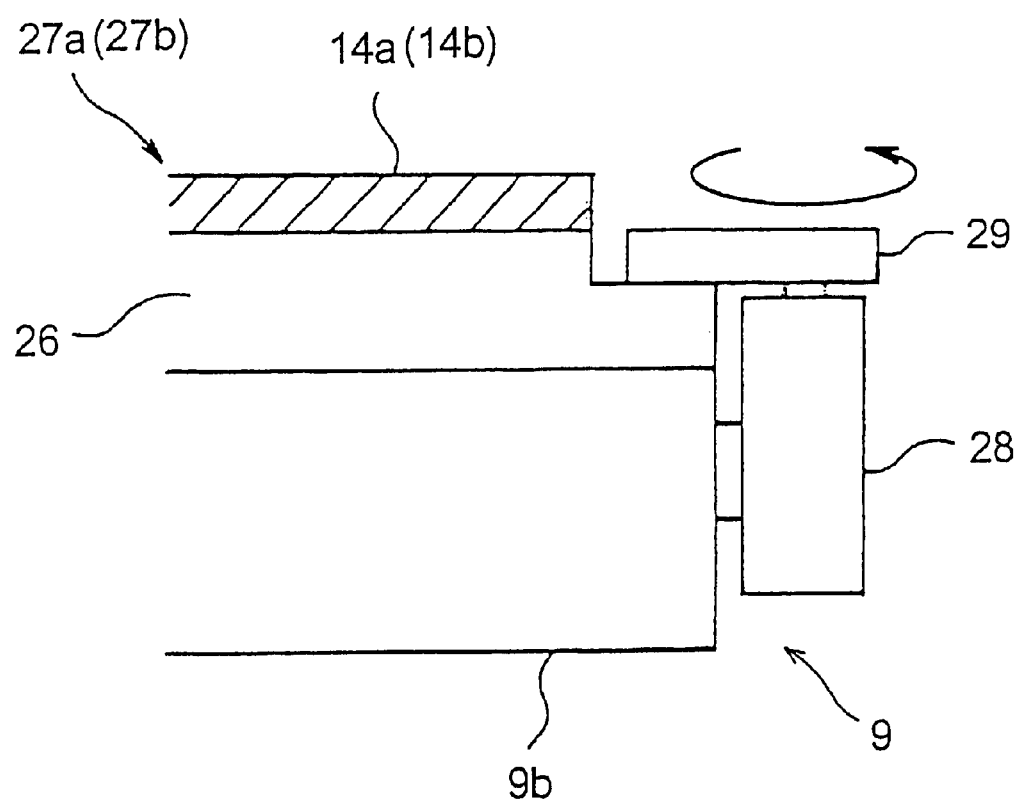
FIG. 5 is a cross sectional view of the turntable of the polishing apparatus shown in FIG. 1.

FIG. 5 shows a mechanism for fixing the first fixed abrasive polishing tool 14a to the surface plate 9b of the turntable 9. The fixed abrasive polishing tool 14a is hard and easily broken or damaged by loaded impact. Therefore, in the embodiment, fixed abrasive polishing tool 14a is bonded to a metal disk 26 made of aluminum or the like by adhesives to construct a detachable polishing tool cartridge 27a. The surface plate 9b has a clamp mechanism 28 having a movable arm 29 for clamping an outer flange of the polishing tool cartridge 27a. Thus, by placing the fixed abrasive polishing tool 14a on the turntable 9 while the movable arm 29 is open, and then by turning it to a closed position, the fixed abrasive polishing tool 14a is secured to the turntable 9 with a spring mechanism (not shown) incorporated in the movable arm 29. The fixed abrasive polishing tool 14a can be detached from the turntable 9 by turning the movable arm 29 to the open position.

Figure 6:
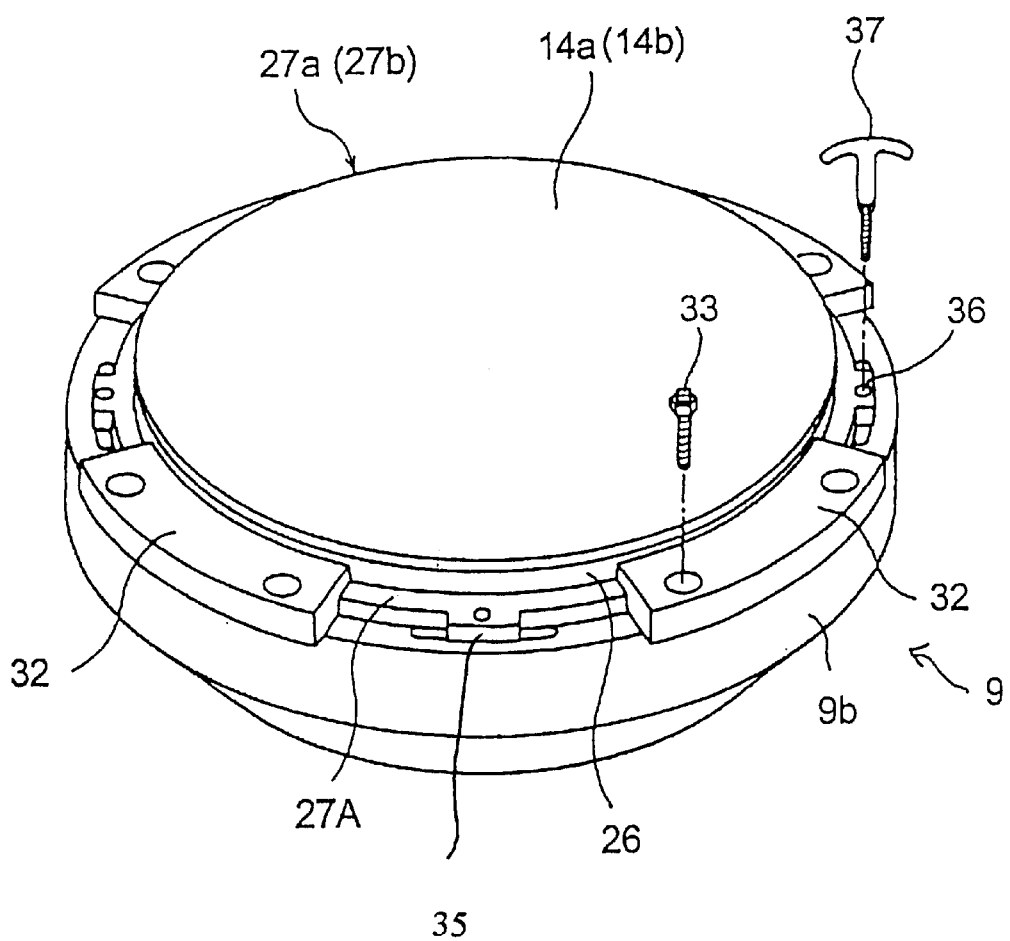
FIG. 6 is a cross sectional view of another embodiment of the turntable of the polishing apparatus of FIG. 1.

FIG. 6 shows another mechanism for clamping the fixed abrasive polishing tool 14a to the turntable 9. The fixed abrasive polishing tool 14a is bonded to a metal disk 26 made of aluminum or the like which has an outer flange 27A to construct a polishing tool cartridge 27a. The polishing tool cartridge 27a is fixed by clamping the flange 27A by clamps 32 that are fastened to the surface plate 9b by bolts 33. Each of the clamps 32 comprises a relatively long arcuate member which subtends 44° at the center of curvature thereof, and is fastened by two bolts 33 to sandwich the outer flange 27A between itself and the upper surface of the surface plate 9b. Therefore, the fixed abrasive polishing tool 14a can easily be fastened to and removed from the surface plate 9b by tightening and loosening the bolts 33. The relatively wide clamps 32 are employed to stably secure the outer flange 27A to the surface plate 9b for thereby preventing the surface of the fixed abrasive polishing tool from flexing due to being pressed against the semiconductor wafer.

In FIG. 6, the flange 27A of the polishing tool cartridge 27a has four teeth 35 projecting radially outwardly from an outer circumferential edge thereof The teeth 35 have respective screw holes 36 in which lifting or pushing bolts 37 can be threaded. Since the fixed abrasive polishing tool 14a is considerably heavy, the lifting bolts 37 allow the worker to handle the fixed abrasive polishing tool 14a easily. On the other hand, the pushing bolts 37 can be used to assist in peeling the fixed abrasive polishing tool 14a off the turntable 9 for removal. That is, when the pushing bolts 37 are threaded into the screw holes 36 and continuously turned after their tip ends abut against the surface of the surface plate 9b, the pushing bolts 37 automatically lift the fixed abrasive polishing tool 14a off the turntable 9. The surface plate 9b has arcuate grooves 36 defined in its upper outer circumferential surface below the respective teeth 35 for receiving the tip ends of the bolts 37 therein.

In the embodiment shown in FIG. 6, there are four clamps 32 and four teeth 35. Preferably, an annular clamp can be used to clamp the entire outer flange 27A of the fixed abrasive polishing tool 14a to apply a uniform pressure to the outer flange 27A for thereby more stably holding the cartridge 27a on the surface plate 9b. The number of teeth 35 may be increased or reduced in view of the weight of the fixed abrasive polishing tool 14a or the desired level of intimate contact between the fixed abrasive polishing tool 14a and the surface plate 9b. The metal disk 26 to which the fixed abrasive polishing tool is bonded may be made of a material other than aluminum such as stainless steel, titanium, or the like, or may be replaced with a disk of synthetic resin having greater resistance to corrosion. Other methods for fixing the cartridge 27a may be employed such as vacuum chucking which utilizes suction force from inside the surface plate 9b, magnetic chucking which applies electro-magnetism or permanent magnetism attraction forces, or fastening by pins.

The fixed abrasive polishing tool for use in the first polishing process is hard and may be easily broken, and thus it is suitable to handle it assembled in a cartridge form as described above. On the other hand, the second fixed abrasive polishing tool 14b has some elasticity and can be handled like a conventional polishing pad. That is, a polishing table used for conventional polishing cloths can be used as it is by bonding the fixed abrasive polishing tool on a surface plate 9b with an adhesive. A metallic surface plate 26 can be used to attach the tool thereon. The second fixed abrasive polishing tools 14b can be assembled in a polishing tool cartridge 27b as depicted in parentheses in FIGS. 5 and 6, thereby providing convenience in tool change operations and shortening the operation time.

Figure 22:
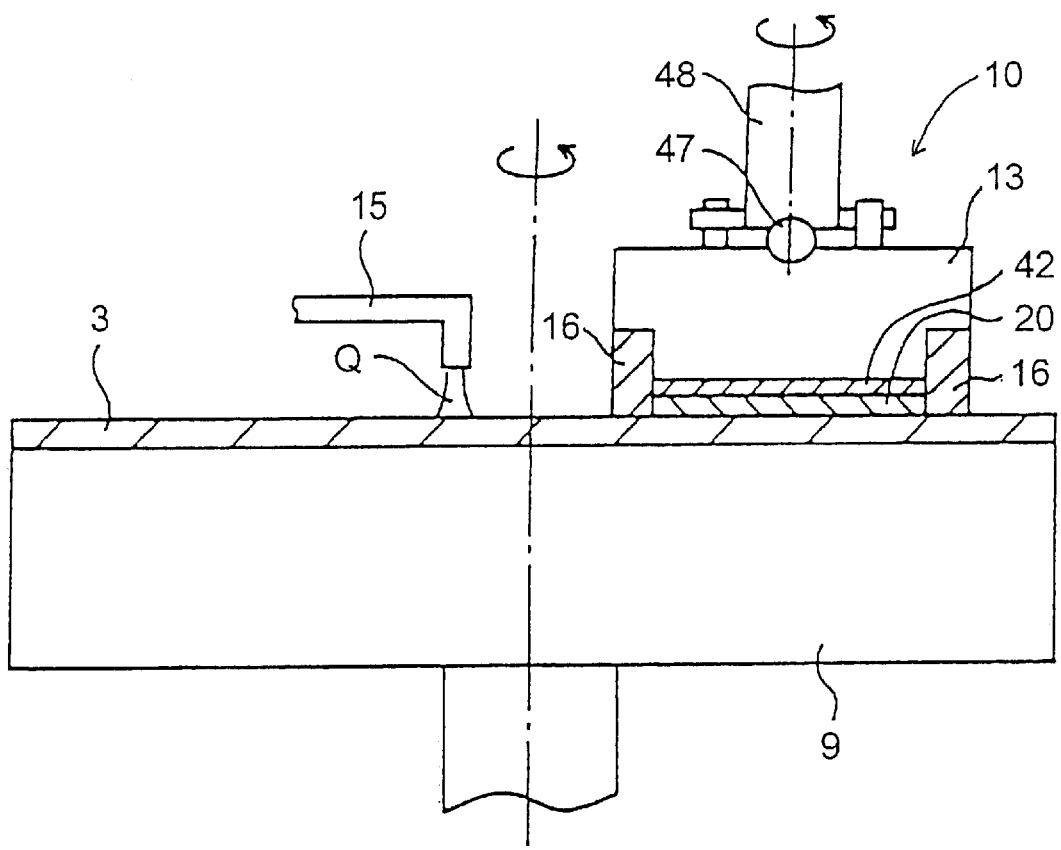
FIG. 22 is a schematic cross sectional view of a conventional polishing apparatus.
Figure 23:
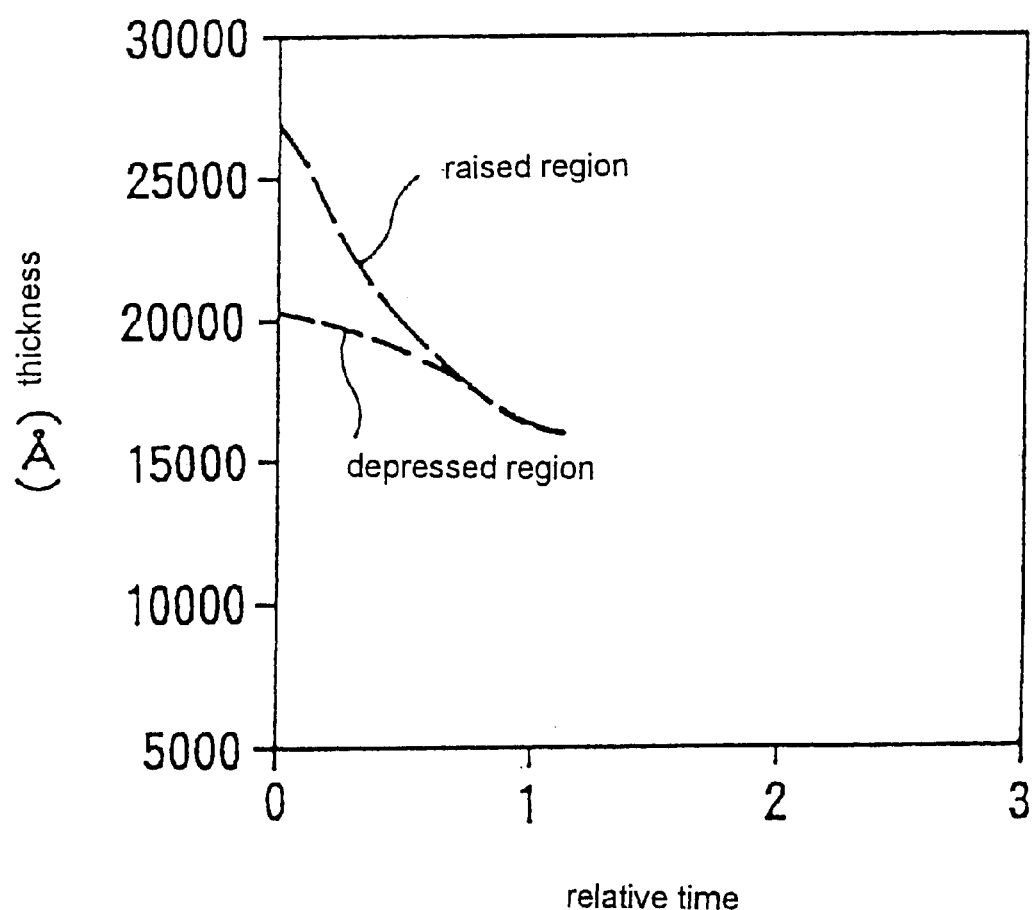
FIG. 23 is a graph illustrating a process of polishing by the conventional polishing apparatus.

The top ring used for the first polishing process is the same as the conventional one shown in FIG. 22. Since the guide ring (wafer retaining ring) is aimed for preventing the wafer from disengaging from the top ring, it is not necessary to be vertically movable. And it is enough for the guide ring to protrude from the bottom surface of the top ring by a short distance smaller than the wafer thickness, thus forming a gap between the bottom surface of the guide ring and the surface of the fixed abrasive tool while polishing. If the tool should be the soft one, then the wafer will plunge itself into the tool by a pressing force applied from the top ring, and excessive polishing of the edge portion of the wafer will round off the lower corner of the edge. However, the first fixed abrasive tool is hard enough to avoid such phenomena so that tools shown in FIG. 22 or FIG. 3 is sufficient.

(3) Top Ring for the Finish Polishing

Figure 7:
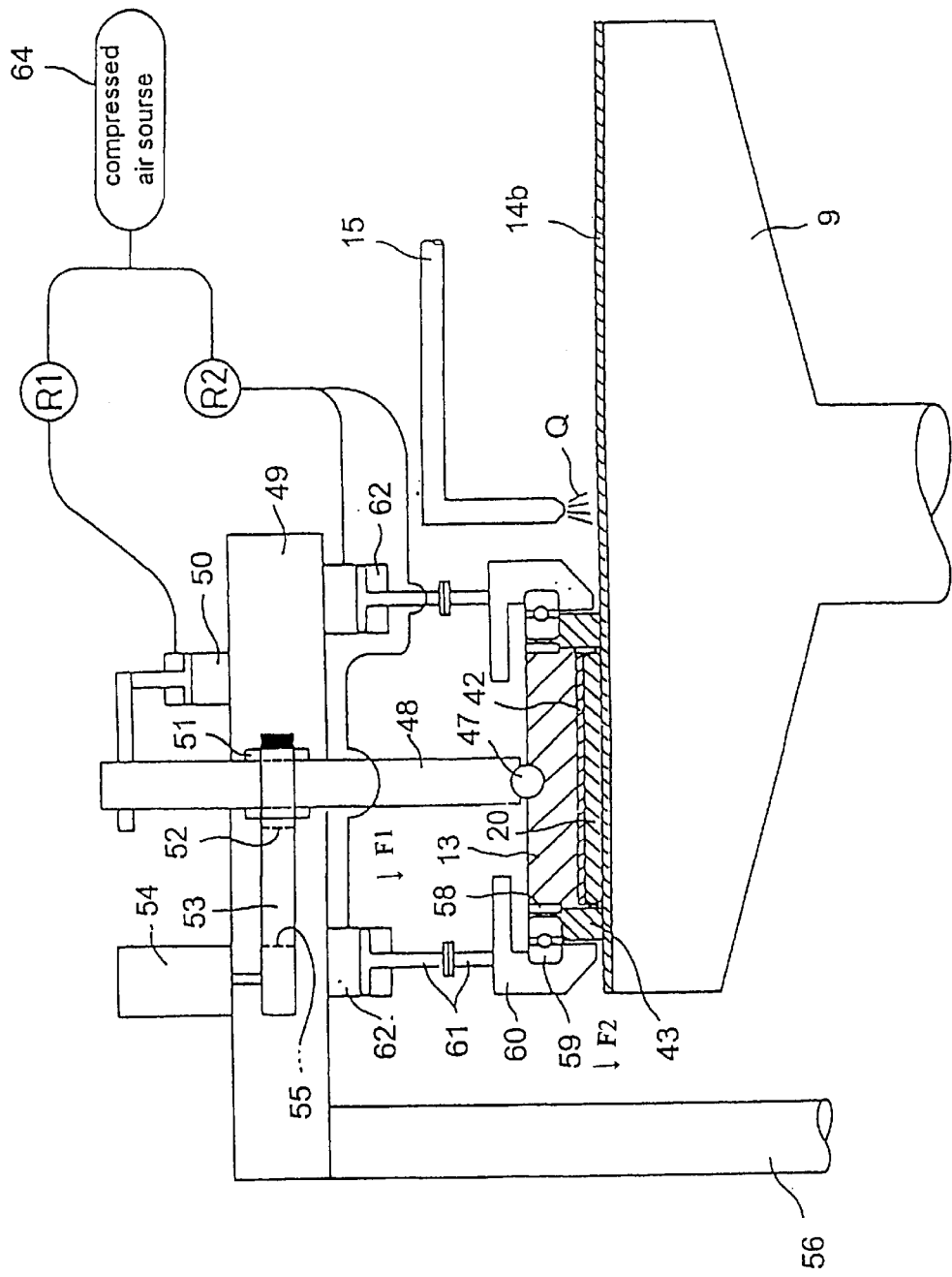
FIG. 7 is a schematic cross sectional view of the top ring shown in FIG. 1.

FIG. 7 shows the top ring 13 of the second polishing unit 1b for finish polishing. The top ring 13 has a presser ring 43 disposed around the top ring 13 and vertically movable with respect to the top ring 13. The top ring 13 is connected to a vertical top ring shaft 48 whose lower end via a ball 47 serves as a universal joint mounted on an upper surface of the top ring 13. The top ring shaft 48 is operatively coupled to a top ring air cylinder 50 fixedly mounted on an upper surface of a top ring head 49. The top ring shaft 48 is vertically movable by the top ring air cylinder 50 for pressing the semiconductor wafer 20 held at the lower surface of the top ring 13 against the abrasive cloth 14b on the turntable 9. Here, an elastic pad 42 is intervened to buffer between the bottom surface of the top ring and the wafer 20.

The top ring shaft 48 is corotatably coupled to a rotatable cylinder 51 by a key (not shown), and the rotatable cylinder 51 has a pulley 52 mounted on the outer circumferential surface thereof The pulley 52 is operatively connected by a timing belt 53 to a timing pulley 55 mounted on the rotatable shaft of a top ring motor 54, which is fixedly mounted on the top ring head 49. Therefore, when the top ring motor 54 is energized, the rotatable cylinder 51 and the top ring shaft 48 are integrally rotated through the timing pulley 55, the timing belt 53 and the timing pulley 52 to rotate the top ring 13. The top ring head 49 is supported by a top ring head shaft 56 which is vertically fixed on a frame (not shown).

Thus, the presser ring 43 is coupled to the top ring 13 by a key 58 in a corotatable and vertically movable manner. The presser ring 43 is rotatably supported by a bearing 59 which is mounted on a bearing holder 60. The bearing holder 60 is connected by vertical shafts 61 to a plurality of (three in this embodiment) circumferentially spaced presser ring air cylinders 62. The presser ring air cylinders 62 are secured to a lower surface of the top ring head 49.

The top ring air cylinder 50 and the presser ring air cylinders 62 are pneumatically connected to a compressed air source 64 through regulators R1, R2, respectively. The regulator R1 regulates an air pressure supplied from the compressed air source 64 to the top ring air cylinder 50 to adjust the pressing force which is applied by the top ring 13 to press the semiconductor wafer 20 against the second fixed abrasive polishing tool 14b. The regulator R2 also regulates the air pressure supplied from the compressed air source 64 to the presser ring air cylinders 62 to adjust the pressing force which is applied by the presser ring 43 to press the second fixed abrasive polishing tool 14b. The regulators R1 and R2 are controlled by a controller (not shown in FIG. 7).

Figure 8:
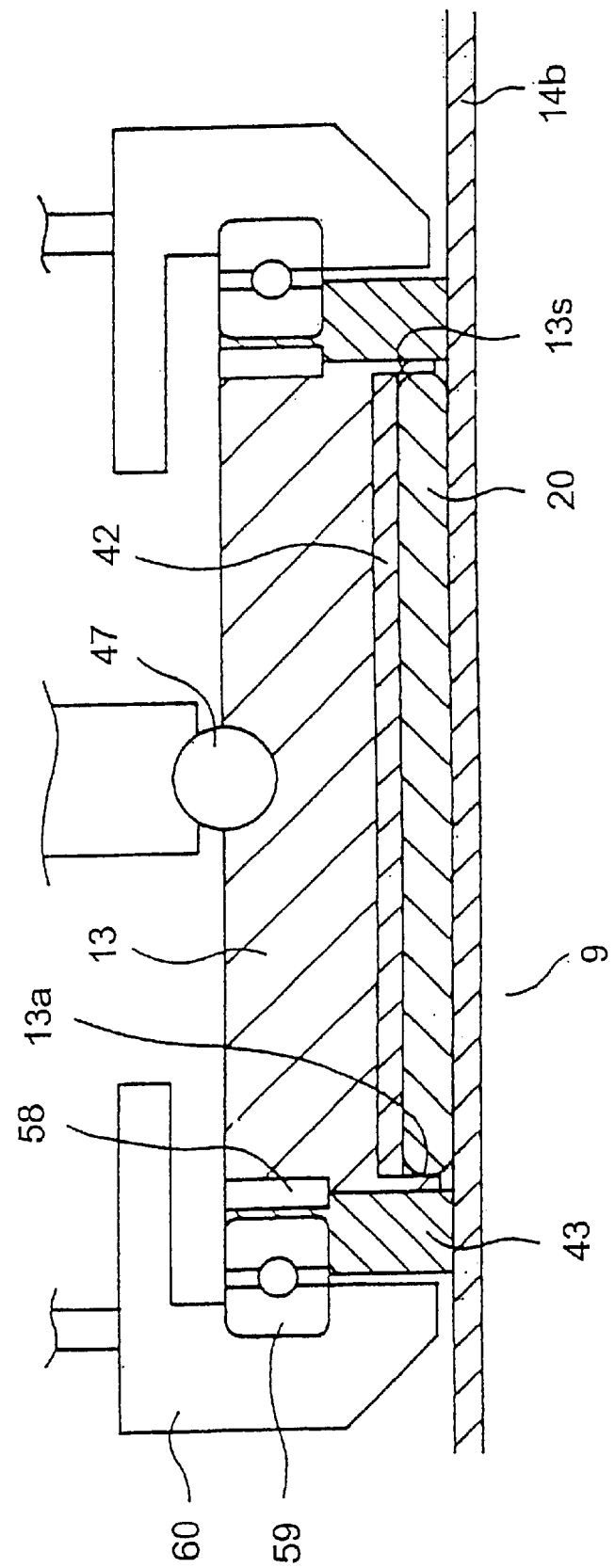
FIG. 8 is an enlarged view of the essential parts of the top ring shown in FIG. 7.

FIG. 8 shows the assembly of the top ring 13 and the presser ring 43, where the top ring 13 has an outer circumferential annular flange 13s extending downwardly toward the turntable 9. The lower surface of the top ring 13 and the annular flange 13s jointly define a recess 13a for accommodating the semiconductor wafer 20 therein.

Depending on the pressing force applied by the top ring 13 actuated by the top ring air cylinder 50, the pressing force applied to the second fixed abrasive polishing tool 14b by the presser ring 43 actuated by the presser ring air cylinders 62 is adjusted while the semiconductor wafer 20 is being polished. During the polishing process, the pressing force F1 (see FIG. 7) which is applied by the top ring 13 to press the semiconductor wafer 20 against the second fixed abrasive polishing tool 14b can be adjusted by the regulator R1, and the pressing force F2 which is applied by the presser ring 43 to press the second fixed abrasive polishing tool 14b can be adjusted by the regulator R2, thus, the pressing force F2 can be changed depending on the pressing force F1. By adjusting the pressing force F2 with respect to the pressing force F1, the distribution of polishing pressures is made continuous and uniform from the center of the semiconductor wafer 20 to its peripheral edge and further to the outer circumferential edge of the presser ring 43 disposed around the semiconductor wafer 20. Consequently, the peripheral portion of the semiconductor wafer 20 is prevented from being polished excessively or insufficiently. The semiconductor wafer 20 can thus be polished to a high quality with a high yield.

If a greater or smaller thickness of material is to be removed from the peripheral portion of the semiconductor wafer 20 than from the inner region of the semiconductor wafer 20, then the pressing force F2 applied by the presser ring 43 is selected to be of a suitable value based on the pressing force F1 applied by the top ring 13. Thus, it is possible to intentionally increase or reduce the amount of a material removed from the peripheral portion of the semiconductor wafer 20.

In the first embodiment, since the semiconductor wafer 20 is accommodated in the recess 13a of the top ring 13 and protected by the annular flange 13s, the outer circumferential surface of the semiconductor wafer 20 at its peripheral edge is not rubbed by the presser ring 43 when the presser ring 43 is vertically moved with respect to the top ring 13. Therefore, the presser ring 43 as it is vertically moved with respect to the top ring 13 does not adversely affect the polishing performance of the polishing apparatus during the polishing process. However, it is possible to directly support the edge of the wafer 20 by the presser ring 43 by dispensing with the annular flange 13s. In the first polishing process, since the fixed abrasive polishing tool is hard, the wafer scarcely plunges itself into the tool. Thus, the top ring mechanism 10 only having the usual guide ring 16 shown in FIG. 3 is sufficient.

(4) Fixed abrasive polishing tool

The first and second fixed abrasive polishing tools will be explained hereinafter. Fixed abrasive polishing tools are generally comprised of a binder (binding medium) forming a matrix and abrasive particles dispersed therein. Binders are usually comprised of a resin or polymerized macro molecules, which are manufactured by polymerizing a resin precursor including dispersed abrasive particles to concurrently shape it into a certain form. Suitable additives formed in particle materials are added in the resin precursor to adjust the physical properties of the binder. The most significant difference between the first and second fixed abrasive polishing tools is the hardness (elasticity) of the matrix, which is mainly established by changing the material.

Figure 9:
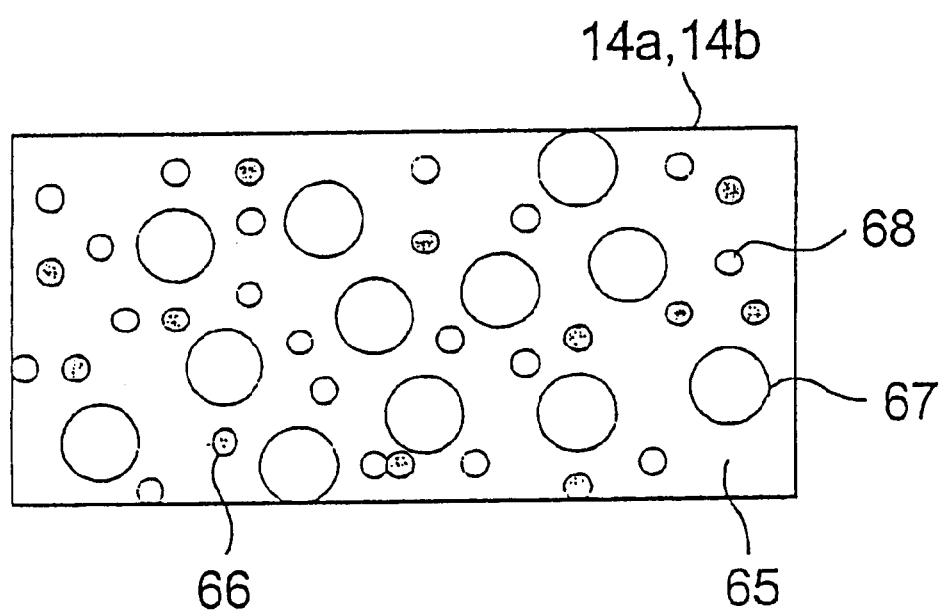
FIG. 9 is a schematic cross sectional view of the fixed abrasive polishing tool according to the present invention.

FIG. 9 schematically shows a construction of the fixed abrasive polishing tools 14a, 14b according to the present invention, wherein, in a binder 65 consisting of matrix of the tool, abrasive particles 66, elastic micro-particles 67, and pores 68 are dispersed in respective predetermined compositions.

As for the abrasive particles, such materials as cerium oxide ($CeO_2$), $SiO_2$, $Al_2O_3$, $ZrO_2$, $MnO_2$, and $Mn_2O_3$ are used. Cerium oxide ($CeO_2$) and $Al_2O_3$ are suitable for polishing the insulative films, and $Al_2O_3$ and $SiO_2$ are suitable for polishing the metallic films. Any of those can be used for both the first and second fixed abrasive polishing tools. Except for other requirements, $Al_2O_3$ is suitable for the first fixed abrasive polishing tool for its high hardness.

It is known that using finer abrasive particles can realize scratch-less polishing. Thus, by manufacturing granules of fine abrasive particles which are easily crushed and dispersed, and by adapting them for fixed abrasives, scratch-less polishing can be realized. Following is an example of embodied numerical data. The abrasive particles used for the first fixed abrasive polishing tool 14a have an average diameter of less than 1.0 μm, and a maximum diameter of less than 3 μm. The abrasive particles used for the second fixed abrasive polishing tool 14b have an equivalent or smaller size compared to the first fixed abrasive polishing tool. However, such numerical data is dependent on selection of the resin material etc. Those data is not applicable when softer abrasive particles are used for the second fixed abrasive polishing tool 14b than for the first fixed abrasive polishing tool 14a.

As for the binder 65, suitable materials for the hard binder used in the first fixed abrasive polishing tool 14a are: phenol (PF), urea (UF), melamine (MF), unsaturated polyester (UP), epoxy (EP), polyvinyl chloride (PVC), acrylonitrile styrene (AS), polymethyl methacrylate (PMMA), polyamide (PA), polycarbonate (PC), polyphenylene ether (PPE), polybutylene terephthalate (PBT), polysulfone (PSF), polyether sulfone (PES), polyphenylene sulfide (PPS), polyalylate (PAR), polyamide imide (PAI), polyether imide (PEI), polyether ether ketone (PEEK), polyimide (PI), etc.

Soft fixed abrasive polishing tools can be established by applying the following methods.

a) Using soft materials (selection of binder material, or curing condition of the binder),
b) Raising the porosity (using foaming agent, mixing cellular particles, entraining air when mixing), and
c) Using a composite material including soft particles such as rubber.

Suitable materials other than the rubber based resins for the soft binder for the second fixed abrasive polishing tool are foamed or cellular resins. Materials for the foamed resins comprise: polyurethane (PUR), polyvinyl alcohol (PVA), polyvinylidene chloride (PVDC), polyethylene (PC), polypropylene (PP), polyvinylidene fluoride (PVDF), polystyrene (PS), acrylonitrile butadiene styrene (ABS, hereinafter), polyacetal (POM), ultra high molecular weight polyethylene (UHMW-PE), polyethylene terephthalate (PET),polytetrafluoroethylene (PTFE), polyvinyl fluoride, polychlorotrifluoroethylene, vinyl fluoride, vinylidene fluoride, dichlorofluoroethylene: vinyl chloride, vinylidene chloride, perfluoro-alpha. -olefins (such as: hexafluoropropylene, perfluorobutene-1, perfluoropentene-1, perfluorohexen-1) perfluorobutadiene, chlorotrifluoroethylene, trichloroethylene, tetrafluoroethylene, perfluoroalkyl perfluorovinyl ethers (such as: perfluoromethyl perfluorovinyl ether, perfluoroethyl perfluorovinyl ether, perfluoropropyl perfluorovinyl ether), alkyl vinyl ether having 1 to 6 carbon atoms, aryl vinyl ether having 6 to 8 carbon atoms, alkyl vinyl ether having 1 to 6 carbon atoms, aryl perfluorovinyl ether having 6 to 8 carbon atoms, ethylene, propylene, styrene, a copolymer of vinylidene fluoride and tetra fluoroethylene, a copolymer of vinylidene fluoride and hexafluoropropylene, a copolymer of tetrafluoroethylene and ethylene, a copolymer of tetra fluoroethylene and propylene, a copolymer of ethylene and chlorotrifluoroethylene, a copolymer of tetrafluoroethylene and chlorotrifluoroethylene,a copolymer of tetrafluoroethylene and hexafluoropropylene, a copolymer of tetra fluoroethylene and perfluoromethyl perfluorovinyl ether, a copolymer of tetra fluoroethylene and perfluoroethyl perfluorovinyl ether, a copolymer of tetrafluoroethylene and perfluoropropyl perfluorovinyl ether, a copolymer of tetrafluoroethylene, hexafluoropropylene and perfluoromethyl perfluorovinyl ether, a copolymer of tetra fluoroethylene, hexafluoropropylene and perfluoroethyl perfluorovinyl ether, a copolymer of tetrafluoroethylene, hexafluoropropylene and perfluoropropyl perfluorovinyl ether, etc. Though it is a principle to use a binder having a smaller elastic Modulus for the second fixed abrasive polishing tool 14b than that for the first fixed abrasive polishing, tool 14a, this may change depending on the subject to be polished or the type of abrasive particles used.

Manufacturing processes of the fixed abrasive polishing tool, which are commonly applicable to both the first and second polishing tools, are exemplified as follows: compression molding, transfer molding, injection molding, extrusion molding, cast molding, slash molding, cold molding, blow molding, vacuum molding, and machining, etc. In order to raise the porosity, it is preferable to cast the resin precursor blended with a foaming agent, or to mix cellular particles made from a material such as polyacrylonitrile (PAN).

Another method comprises adding rubber based particles into the binder 67 as shown in FIG. 9. By dispersing such rubber based particles as elastic particles into the binder with a given composition, the soft elastic particles absorb impact energy in a microscopic aspect. Therefore, when they are used in the second fixed abrasive polishing tool 14b, scratch generation is suppressed to establish high grade polishing.

Examples of materials for the elastic particles are: isoprene rubber (IR), styrene butadiene rubber (SBR), butadiene rubber (BR), chloroprene rubber (CR), butyl rubber (BR), acrylonitrile butadiene rubber (NBR), ethylene propylene rubber (EPM, EPDM), chlorosulfonic polyethylene (CSM), acrylic rubber, a copolymer of acrylic acid alkylether and 2-chloroethyl vinyl ether, a copolymer of acrylic acid alkylether and acrylonitrile, urethane rubber (or polyurethane rubber), sillicon rubber, fluorinated rubber, and polysulfide rubber. Especially, chlorosulfonic polyethylene (CSM) is superior in weather-resistance, acid resistance, inorganic chemical resistance, and abrasion resistance; a copolymer of acrylic acid alkylether and 2-chloroethyl vinyl ether, and a copolymer of acrylic acid alkylether and acrylonitrile are superior in heat resistance, and fluorinated rubber is superior in heat resistance, chemical resistance, and weather-resistance. Silicon rubber is particularly suitable because it is, not only superior in heat resistance, but is usable within a wide temperature range, and is deterioration resistant. It is also effective to use cellular particles made of polyacrylonitrile etc.

Suitable hardness for the first fixed abrasive polishing tool 14a is a Vicker's Hardness of 10~70, and an elastic modulus of 1000~10000 kgf/cm$^2$ (9800~98000 N/cm$^2$), preferably 3000~7000 kgf/cm$^2$ (29400~68600 N/cm$^2$). On the other hand, a suitable hardness for the second fixed abrasive polishing tool 14b is a Shore's Hardness of 20~50, preferably 30~40, and an elastic modulus of 300~1000 kgf/cm$^2$ (2940~9800 N/ cm$^2$), preferably 450~700 kgf/cm$^2$ (4410~6860 N/cm$^2$). Here, "elastic modulus of the fixed abrasive polishing tool" refers to the physical property of the fixed abrasive portion. When the tool comprises a laminated configuration as described hereinafter, the term "elastic modulus of the fixed abrasive polishing tool" is used to refer to the physical property of the upper layer, i.e., the fixed abrasive portion.

Figure 10A:
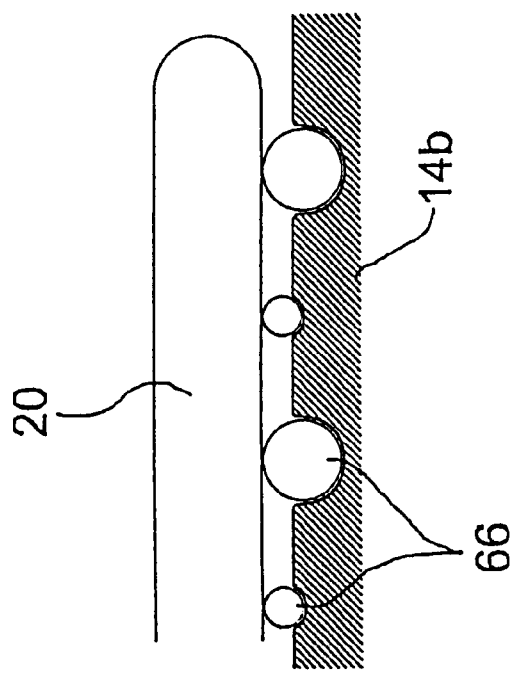
FIGS. 10A and 10B are schematic cross sectional views illustrating the polishing action of the fixed abrasive polishing tool according to the present invention.
Figure 10B:
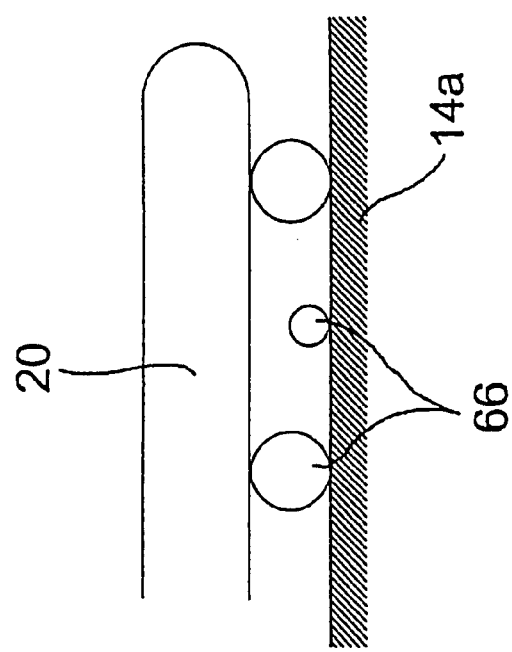

Here, the mechanism of a soft type fixed abrasive polishing tool removing scratches from the wafer surface will be explained. In the case of the hard type fixed abrasive polishing tool 14a shown in FIG. 10(A), the polishing surface is difficult to deform. Therefore, when the abrasive particles have a wide variance of diameter distribution, only large particles contact the surface of the wafer 20 to be polished. Thus, the abrasive particles 66 load excessive force on the wafer to cause scratch creation thereon. In the case of the soft type fixed abrasive polishing tool 14b shown in FIG. 10B, larger particles are likely to be embedded in the matrix of the polishing tool, thus narrowing the gap between the wafer 20 and the polishing tool 14b, and thereby enabling the smaller abrasive particles 66 to contact the wafer 20. Therefore, a large number of abrasive particles 66 contact the wafer 20 to lessen and level the working force applied from each of the abrasive particles 66, and an excessive force load hardly occurs, thus preventing scratches.

Figure 11:
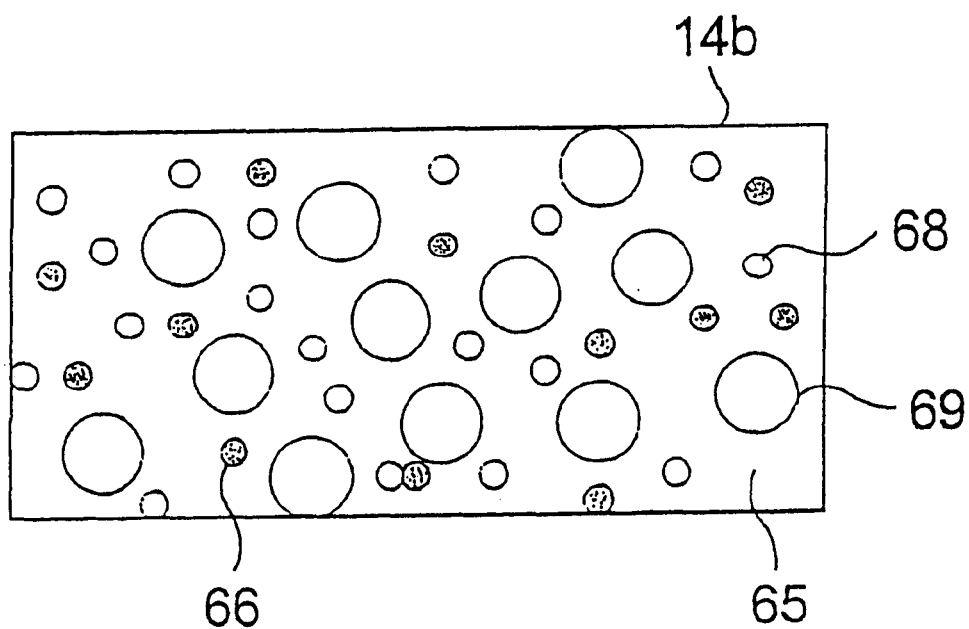
FIG. 11 is a schematic cross sectional view of the fixed abrasive polishing tool according to another embodiment of the present invention.

FIG. 11 shows an example where particulate water soluble binders 69 are included in the binder so as to facilitate self-generation of the abrasive particles 66. In this polishing tool, the water soluble binders are resolved into purified water, chemical agent or slurry supplied during polishing, thereby decreasing the binding force for the abrasive particles to increase the self-generated abrasive particles. Accordingly, a large number of abrasive particles act on the worked surface. That is, effective abrasive particles working on the unit surface area are abundant to reduce the pressing force per one abrasive particle, so that each abrasive particle moderately acts on the worked surface. When the abrasive particles are fine, it is preferable to add a dispersing agent such as a surfactant for dispersing the abrasive particles into the polishing solution.

Figure 12:
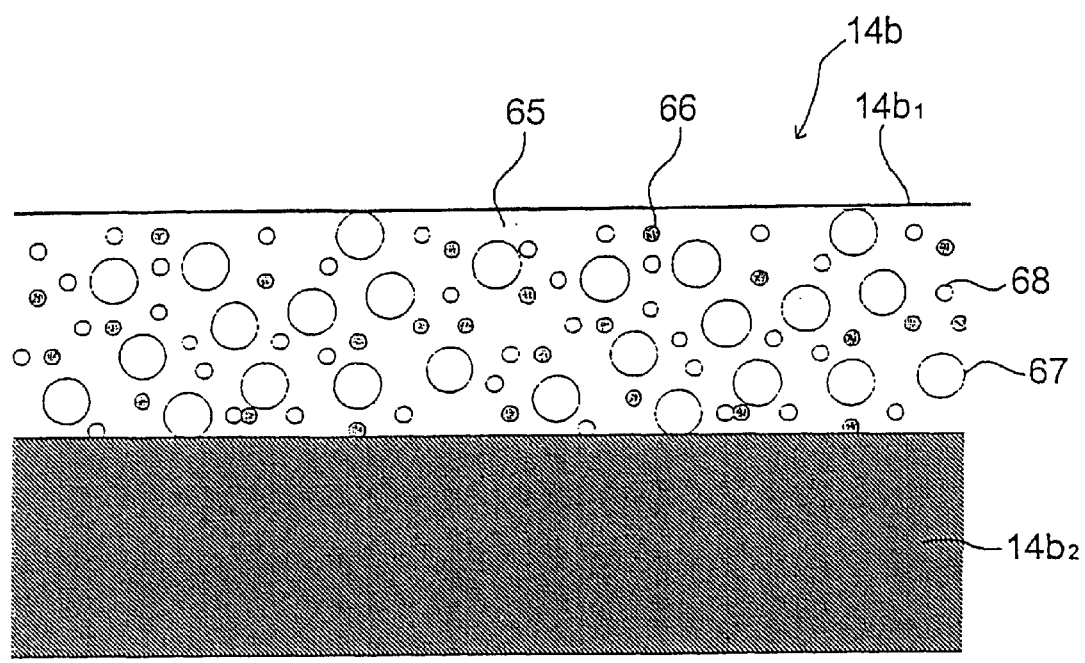
FIG. 12 is a schematic cross sectional view of the fixed abrasive polishing tool according to yet another embodiment of the present invention.

The second fixed abrasive polishing tool 14b shown in FIG. 12 has a laminated configuration having: a soft fixed abrasive polishing tool layer 14b, described above, as an upper layer, and an elastic body $14b_2$, such as non-woven fabric or foamed resin, which is softer than the upper layer, as a lower layer. Such configuration gives an overall softness to the fixed abrasive polishing tool.

As to the thickness, there is no restriction other than that ascribable to the manufacturing process etc. However, as the second fixed abrasive polishing tool 14b is soft, it is preferably thin enough to avoid a large elastic deformation. The first fixed abrasive polishing tool 14a has no such restriction. It is especially recommended to make the fixed abrasive polishing tool thick, in general, because a thick tool can be reused by dressing or reconditioning the surface to obtain a longer life, as will be described later. According to the inventor's experience, it is recommendable to make the first fixed abrasive polishing tool 14a more than 5 mm thick, preferably 10~20 mm thick, and the second fixed abrasive polishing tool 14b less than 5 mm thick, preferably 1~2 mm.

(5) Polishing Step

Recommended polishing conditions using the rotating polishing table for the main and finish polishing processes will be described hereinafter.

The main polishing process comprises dressing of the polishing tool surface and polishing of the wafer on the tool surface. Dressing conditions, for example, are: the number of revolutions for the table/dresser are 25/30 min$^{-1}$, the dressing pressure is 50 g/cm$^2$ (490 mN/cm$^2$); the dressing time is 10 sec. Wafer polishing conditions are: the polishing pressure on the wafer is 300g/cm$^2$ (2940 mN/cm$^2$); the number of revolutions for the table/wafer are 30/35 min$^{-1}$; the supply rate of polishing solution: 200 cc/min, and the polishing solution is purified water (including less than 1 wt % surfactant). Here, the purpose of the dressing is to create minute irregularities on the polishing tool surface. Thus, a certain dressing pressure is necessary, however, excessive pressure will accelerate abrasion of the tool to lower its service life. Thus, the dressing pressure should be less than 200 g/cm$^2$ (1960 mN/cm$^2$), preferably less than 100 g/cm$^2$ (980 mN/cm$^2$). Dressing should be done for each polishing of a wafer. Dressing time should be less than 30 sec, preferably less than 15 sec, for the same reason above. In the wafer polishing, as the polishing tool is hard, polishing pressure on the wafer should be low to suppress damage to the wafer, and preferably less than 300 g/cm$^2$ (2940 mN/ cm$^2$).

The finish polishing process also comprises dressing of the polishing tool surface and polishing of the wafer with the tool surface. Dressing conditions, for example, are: the number of revolutions for the table/dresser are 40/17 min$^{-1}$; the dressing pressure is 200 g/cm$^2$ (1960 mN/cm$^2$); and the dressing time is 17 sec. Wafer polishing conditions are: the polishing pressure on the wafer is 150 g/cm$^2$ (2940 mN/cm$^2$); the number of revolutions for the table/wafer are 70/75 min$^{-1}$; the supply rate of polishing solution is 200 cc/min, and the polishing solution is purified water (including less than 1 wt% surfactant) or chemical agent or slurry. In the case of finish polishing, the dressing pressure should be low as less than 200 g/cm$^2$ (1960 mN/ cm$^2$), preferably less than 100 g/cm$^2$ (980 mN/cm$^2$). Dressing time should be less than 20 sec, preferably less than 10 sec, for the same reason above. The purpose of the finish polishing is to remove surface damage (especially scratches), and excessive pressures may not remove, but sometimes extend, the scratches. In order to effectively remove the scratches, polishing pressures should be low and the relative speed between the wafer and the polishing surface should be high. That is, the polishing pressure should be less than that in the main polishing process so as to be less than 300 g/cm$^2$ (2940 mN/cm$^2$), preferably less than 200 g/cm$^2$ (1960 mN/cm$^2$), and the number of revolutions for the polishing table should be more than 50 min$^{-1}$, preferably more than 70 min$^{-1}$.

The polishing solution should include acid or alkali depending on the subjects to be polished. Macromolecule materials used for the fixed abrasive polishing tool are generally hydrophobic to repel polishing solution. Thus, the tool has a low solution retaining ability, resulting in a failure of stable polishing. This problem is solved by adding surfactant into the polishing solution to provide some hydrophilic property, so that a stable polishing is uniformly performed by the overall surface of the polishing tool. In the finish polishing, additives such as surfactant or glycerine can be used for raising the viscosity of the polishing solution. The time for adding such additives may be at the beginning or at the latter half of the finish polishing. This forms a liquid cushion between the tool surface and the worked subject. Thus, abrasive particles act softly on the surface to reduce the mechanical polishing factor, which allows the tool to have a prominent scratch removing action. After the first polishing process where irregular patterns on the device wafer surface were planarized in the finish process the wafer may be removed of additional surface thickness and then removed of the scratches. In this case, in order to raise the polish rate in the finish polishing process, slurry is supplied or in-situ dressing is performed on the polishing surface during the polishing.

As for the time management for polishing, so-called self-stop function of the fixed abrasive polishing tool can be utilized in the first polishing process. This is a phenomenon where, after the irregularities are eliminated from the worked surface, a further polishing process does not proceed. This is detectable by measuring the load of the driving motor for rotating the turntable or the top ring. When polishing metallic films, another method can detect the endpoint of the first polishing, which is based on film thickness measurement using an eddy current sensor attached to the top ring. In the finish polishing process, scratches existing on the already planarized surface are removed while polishing to the depth of 500–1000 Å. Thus, it is preferable to judge the endpoint by using time management or by measuring the removed thickness with film thickness gauges based on optics or eddy current.

(6) Dressing

The purpose of the dressing in the first polishing process is to roughen the working surface of the fixed abrasive polishing tool to provide fine scratches thereon for promoting self-generation of the abrasive particles. In this first dressing of the hard polishing tool, since the abrasive particles are also hard, a relatively light weight load is sufficient to roughen the fixed abrasive surface. On the other hand, the fixed abrasive polishing tool 14b for the finish polishing process has a certain elasticity, and it is not effectively dressed if the dressing load is so small so as to only deform it. Therefore, a certain amount of dressing load is necessary, which load is usually larger than in the main polishing process.

In the polishing apparatus, dressing of the fixed abrasive polishing tools 14a, 14b is performed concurrently with (in-situ) or prior to (ex-situ) the polishing operation. As shown in FIG. 3, dressing member 18 having a dressing tool 19 at the bottom and the turntable 9 are both rotated. The dressing tool 19 is pressed with a certain pressure against the polishing surface of the first or second polishing tool 14a, 14b at the location diametric to the wafer polishing position. The first fixed abrasive polishing tool 14a has a certain thickness and a uniform abrasive particle distribution for a certain depth, and thus new polishing surfaces are repeatedly formed through dressing processes. Thus frequent changes of the tool are not necessary, thereby allowing efficient polishing with lower costs.

Figure 13:
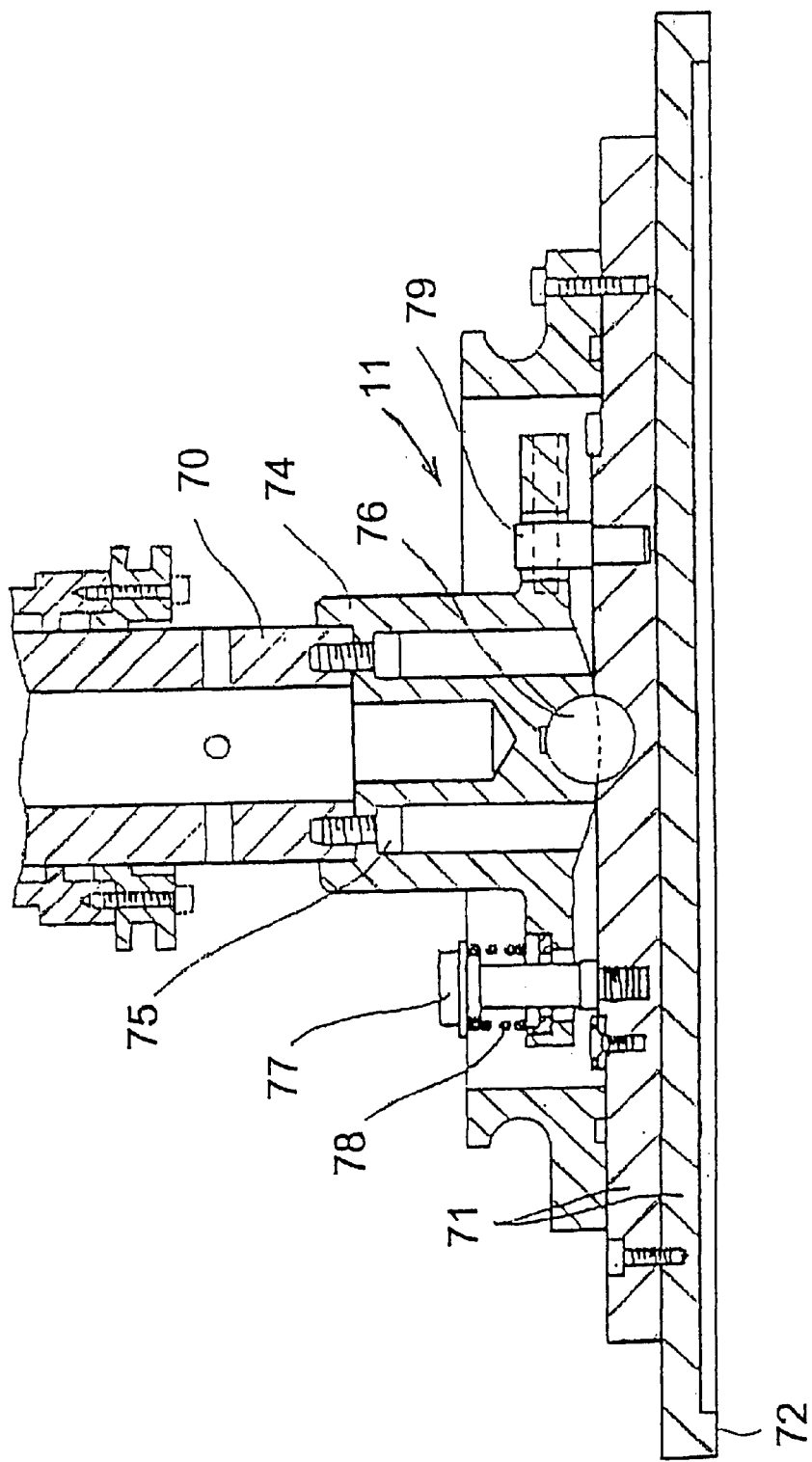
FIG. 13 is a cross sectional view of the dresser according to an embodiment of the present invention.

FIG. 13 shows a diamond dresser as an example of the dresser assembly 11 comprising a dresser body 71 attached to the lower end of a dresser shaft 70, and a dresser plate 72 attached to the lower surface of the dresser body 71 and having a dressing surface on which fine diamond particles are electro-deposited. At the lower end of the dresser shaft 70, an attachment member 74 is secured by bolts 75. A ceramic ball is between the attachment member 74 and the dresser body 71 for forming a universal joint. The dresser body 71 and the attachment member 74 are movably jointed by attachment bolts 77 fixed to the dresser body 71 and coil springs provided between the attachment member 74 and the attachment bolts 77. Transfer pins 79 are provided between the dresser body and the attachment member 74 for transferring rotating forces therebetween. The diamond dresser may be formed by dresser tool segments attached on the dresser body 71 to form an annular dresser tool.

The necessity for concurrent dressing is judged in view of the irregularity conditions of the surface to be polished, for example While the irregularity density is high, such surface condition allow for roughening of the surface of the fixed abrasive polishing tool while polishing, thereby facilitating self-generation of the abrasive particles to provide the tool with further polishing ability. When the irregularity density is low, such mechanism does not work, thus it is preferable to dress the tool concurrently with polishing to forcibly generate the abrasive particles.

Here, dressing solution is supplied from a dressing solution supply nozzle 21 onto the first or second fixed abrasive polishing tool 14a, 14b on or before the time the dressing tool 19 contacts the polishing tool. This is for cleaning away the used abrasive particles or polishing solution remaining on the surface of the fixed abrasive polishing tool 14a, 14b. As the dressing solution, purified water or that added with a surfactant is used. The dressing solution also serves as a coolant to remove frictional heat generated through the dressing opration in which the derssing tool 19 and the first or second fixed abrasive polishing tool 14a, 14b are abraded. The dressing solution supplied on the first or second fixed abrasive polishing tool 14a, 14b are directed to the outside of the table by the centrifugal forces due to the turntable rotation and is collected by the gutter 17a in a lower portion of the frame 17.

Dressing is usually performed mechanically by using a diamond dresser having a bottom surface on which diamond particles are electro-deposited. Another method is usable for fixed abrasive polishing tools of a certain composition, which utilizes electromagnetic wave radiation. This radiation decomposes and embrittles the surface layer of the tool to thereby facilitate roughening of the surface. Such an electromagnetic wave includes intensive ultraviolet irradiated from an excimer lamp, or electron beam. The electromagnetic wave method does not use dressing particles such as diamond particles which may drop on the polishing tool surface, thus preventing potential scratching due to such particles.

Figure 14:
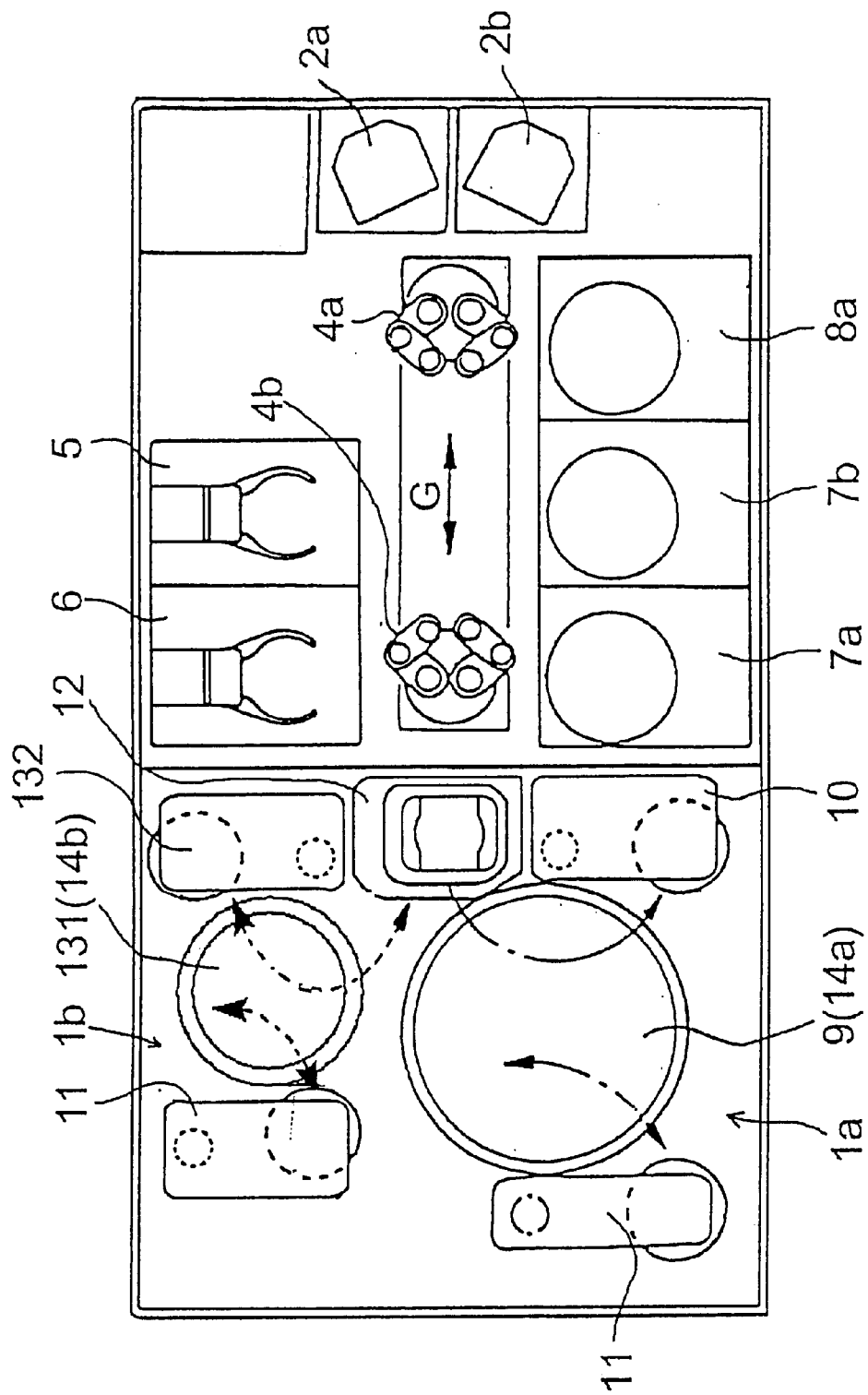
FIG. 14 is an overall plan view of the arrangement of another embodiment of the polishing apparatus according to the present invention.

FIG. 14 shows another embodiment of a whole polishing apparatus construction, in which the second fixed abrasive polishing tool comprises a circulating translational table (a scroll type table). Here, the finish polishing table becomes smaller to render the whole apparatus smaller.

Figure 15:
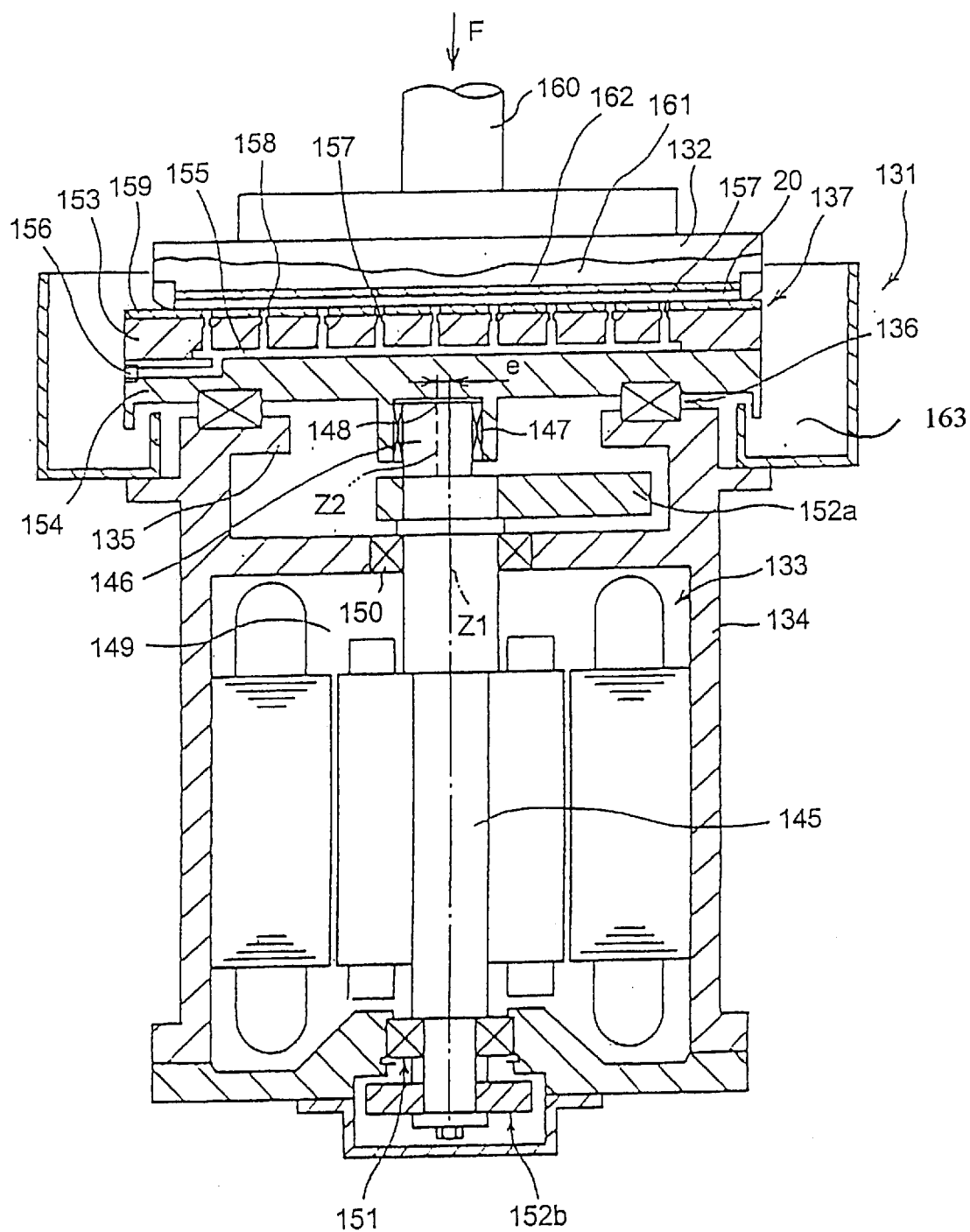
FIG. 15 is a cross sectional view of the turntable of the polishing apparatus shown in FIG. 14.
Figure 16A:
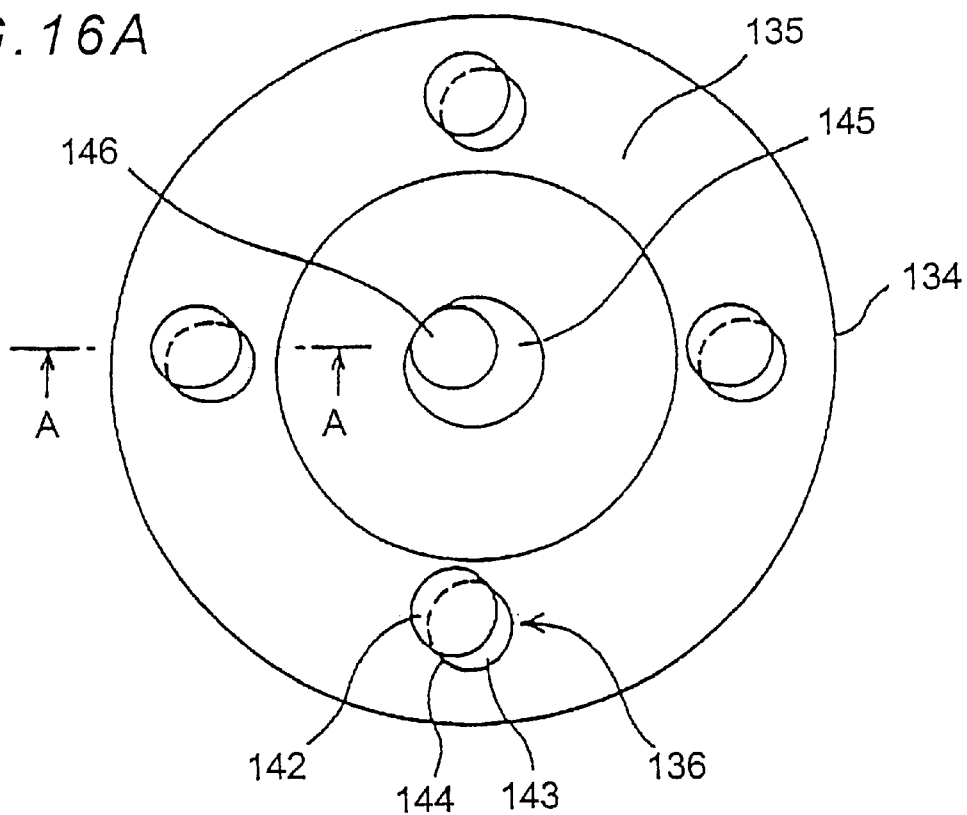
FIGS. 16A and 16B are schematic diagrams of the essential parts of the scroll type polishing apparatus according to an embodiment of the present invention, and show a plan view in FIG. 16A and a cross sectional view in FIG. 16B.
Figure 16B:
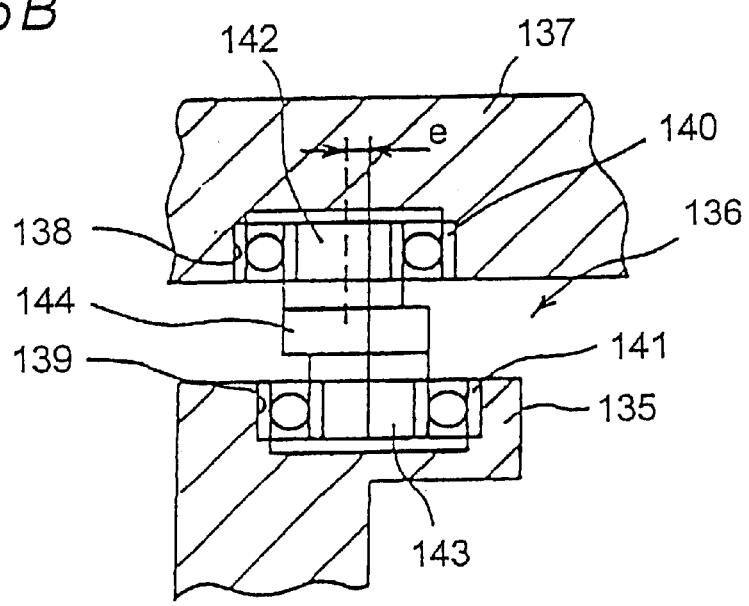

FIGS. 15, 16A, and 16B illustrate a circulative and translational motion mechanism of a scroll type polishing apparatus. Circulative and translational motion means that two surfaces are only provided with a relative translational motion with circular or the like movement without changing the relative orientation. In such a design, the fixed abrasive polishing tool needs to be only slightly larger than the workpiece to be polished, which leads to easy manufacturing of the fixed abrasive polishing tool having a highly flat surface. Further, the drive motor therefor can be small, and the apparatus can also be made smaller and compact so as to save the floor space. The apparatus is comprised of a translational table section 131 to provide circulative and translational motion, and a top ring 132 for holding a wafer 20 with its polishing surface facing downward and to press it against the surface of the fixed abrasive polishing tool.

The translational table 137 comprises a support plate 135, extending inwardly in a ring-shape from the upper portion of a cylindrical casing 134, which houses a motor 133 therein. Three or more support sections 136 are provided at peripheral locations of the support plate 135 for supporting a surface plate 137. That is, respective bearings 140,141 are provided in depressions 138, 139 formed on the confronting surfaces of the support sections 136 and the surface plate 137 at corresponding circumferential locations. Each pair of bearings 140, 141 are connected by a connecting member 144 whose shafts 142, 143 are separated by a distance "e", as shown in FIG. 16B, and whose ends are inserted into the respective bearings. The surface plate 137 thus undergoes a circulative and translational motion along a circle of radius "e".

The surface plate 137 is rotated by the motor 133 whose shaft 145 has an offset drive pin 146 which is inserted in a cavity 148 through a bearing 147. The offset amount is also the same as the distance "e". The motor 133 is housed in the motor chamber 149 in the casing 134, and the shaft 145 is supported by top and bottom bearings 150, 151, and is provided with balancers 152a, 152b to counter balance the offset.

The surface plate 137 has a radius which is slightly larger than the wafer 20 by the offset amount "e", and includes two bonded disk members 153, 154. The two disk members form a space 155 between the disks for flowing water or solution to be supplied to the polishing interface. The space 155 communicates with a solution supply hole 156 formed on the side surface and communicates also with a plurality of liquid holes 157 opening at the upper surface. The surface plate 137 has a second fixed abrasive polishing tool 159 bonded to its top surface. Discharge holes 158 are formed on the surface plate 137 at the corresponding locations of the liquid holes 157 formed on the second fixed abrasive polishing tool 159. These holes 157, 158 are normally distributed evenly across the surface plate 137 and the second fixed abrasive polishing tool 159.

The top ring 132 serves as a pressing tool for the wafer 20, and is attached to the shaft 160 so as to permit a certain degree of tilting with respect to the polishing surface of the wafer 20. The top ring 132 is pressed by an air cylinder, and is rotated by a drive motor via the shaft 160, both of which are not shown. The wafer 20 is attached to the bottom section of the top ring 132 via an intervening elastic mat. The casing 134 has a solution recovery vessel 163 attached to its outer surface at the top.

The process of polishing using the polishing unit will be explained below. The motor 133 is rotated to operate the surface plate 137 in a circulative translational motion, and the wafer 20 attached to the top ring 132 is pressed against the polishing surface of the second fixed abrasive polishing tool 159 bonded to the surface plate 137. Polishing liquid is supplied through the solution supply hole 156, space 155 and holes 157, 158, and is delivered to the polishing interface through the grooves fabricated on the surface of fixed abrasive polishing tool 159.

Here, a circulative and translational motion of a radius "e" is generated between the surfaces of the second fixed abrasive polishing tool 159 and the wafer 20 so as to produce uniform polishing on the entire surface of the wafer 20. In this case, when the positions of the workpiece and the polishing surface are fixed, local differences in the nature of the polishing surface may adversely affect the polished surface. To avoid such an effect, the top ring 132 is slowly rotated by itself so that polishing is not performed in the same spot of the second fixed abrasive polishing tool 159.

In the polishing apparatus shown in FIG. 14, the semiconductor wafer 20 is transferred from the pusher 12, through the top ring assembly 10, the first fixed abrasive polishing tool 14a, the pusher 12, the top ring 132, and the finish fixed abrasive polishing tool 14b, and reaches the pusher 12. In the apparatus, the wafer is polished at two stages by being held by different workpiece holders, i.e., the top ring assembly 10 and the top ring 132. Thus, the top ring assembly 10 of the main polishing unit, after delivering the wafer to the finish process, can commence first stage polishing soon after it is supplied with an unpolished wafer from the pusher 12. Thus, this system can concurrently polish wafers at both first and second stages to increase its throughput. The semiconductor wafer which has been polished nay be cleaned after one or both of the first and finish polish processes by supplying purified water or a chemical solution.

Figure 17:
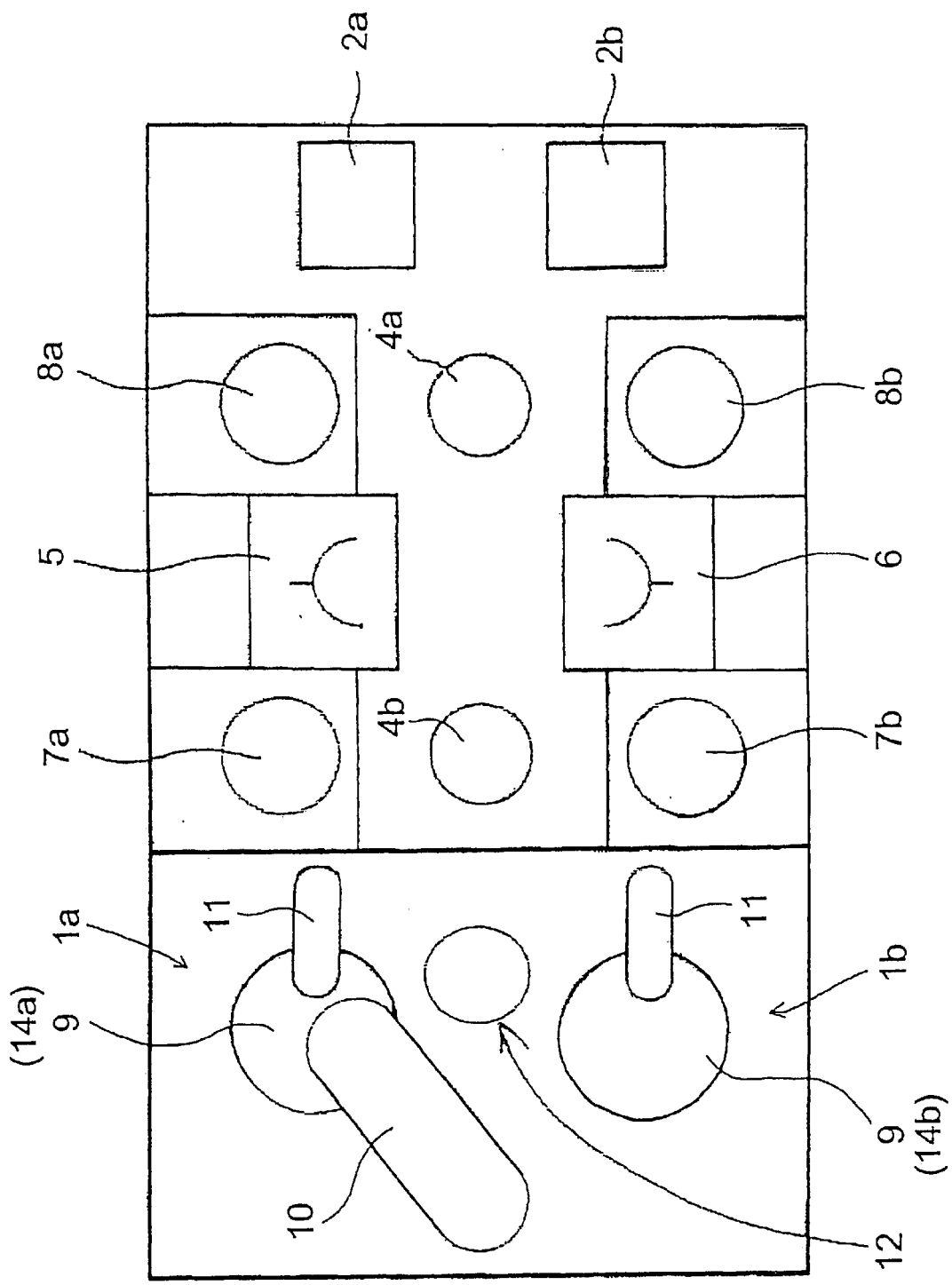
FIG. 17 is an overall plan view of the arrangement of another embodiment of the polishing apparatus according to the present invention.

FIG. 17 shows another embodiment of the present invention, in which first and second polishing units 1a and 1b are respectively comprised of respective turntables 9 and the first and second fixed abrasive polishing tools 14a, 14b attached to the respective turntables 9. In the embodiment, the first and second polishing units commonly have one top ring assembly 10. In this embodiment, wafer 20 is transferred from the pusher 12, through the top ring assembly 10, the first fixed abrasive polishing tool 14a, and the finish fixed abrasive polishing tool 14b, and returns to pusher 12. Thus it is not necessary to deliver the wafer 20 between the first and second polishing processes, thereby shortening the operation cycle.

Figure 18A:
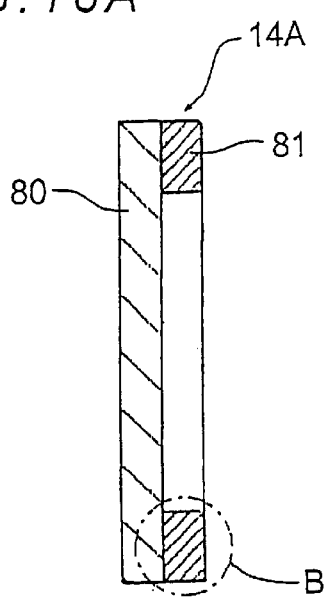
FIGS. 18A to 18C show the fixed abrasive polishing tool according to another embodiment of the present invention, and show a plan view in FIG. 18A, a side view in FIG. 18B, and a cross sectional view in FIG. 18C.
Figure 18B:
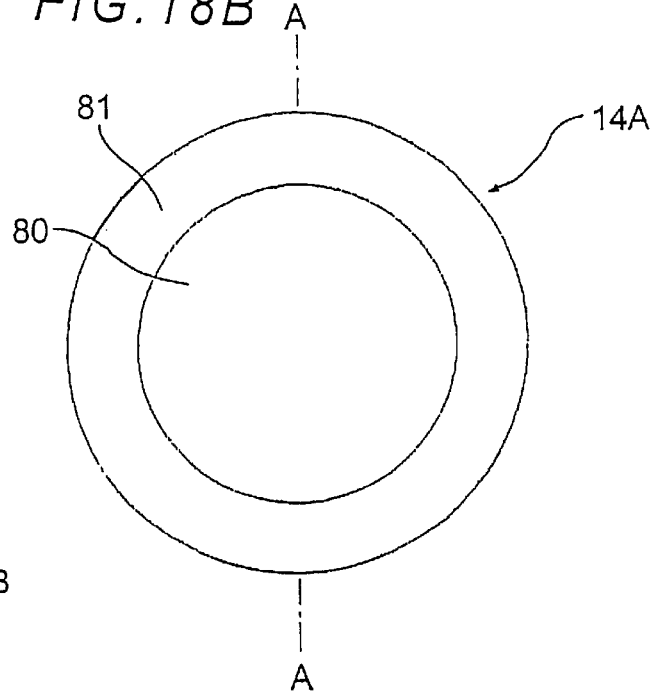
Figure 18C:
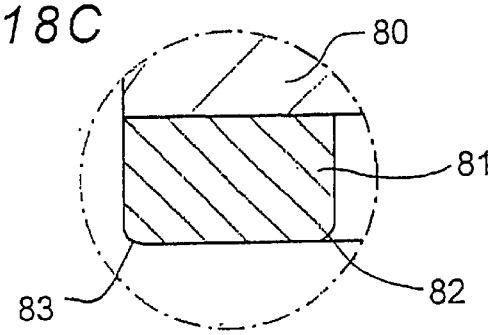

FIGS. 18A–18C show another embodiment of the present invention comprising a ring or cup type fixed abrasive polishing tool 14A. As shown in FIGS. 18A and 18B, the tool 14A is constructed by attaching a ring type fixed abrasive member 81 at the bottom surface of a disc type support member 80. The lower/inner and outer edge portions 82, 83 of the tool 81 are formed with a rounded chamfer of a certain radius as shown in FIG. 18C.

The cup type fixed abrasive polishing tool 14A described above is used on the polishing apparatus shown in FIG. 19. The apparatus comprises a wafer holder 84a for rotatably holding the wafer with its surface to be polished facing upwardly, and a tool holder 85 for holding the fixed abrasive polishing tool 14A with its polishing surface facing downwardly. The wafer holder 84a comprises a rotating table 86 for receiving the wafer on the upper surface thereof, and a translational table 87 for surrounding the wafer with its surface being flush with the wafer and for reciprocally traveling in the direction J. On the other hand, the tool holder 85 comprises a rotational shaft 88 driven by a drive motor and for pressing the fixed abrasive polishing tool 14A downwardly by virtue of an unshown pressing assembly.

In this apparatus, the overall surface of the wafer 20 is polished by independently rotating the wafer holder and the cup type fixed abrasive polishing tool, pressing the polishing tool 14A onto the wafer 20, and reciprocally moving the translational table 87. Here, the inner and outer edge portions 82, 83 of the polishing tool 14A are rounded, thus the wafer 20 is not over-polished by the edge portions 82, 83 so as to establish an overall uniformly polished surface.

Figure 20:
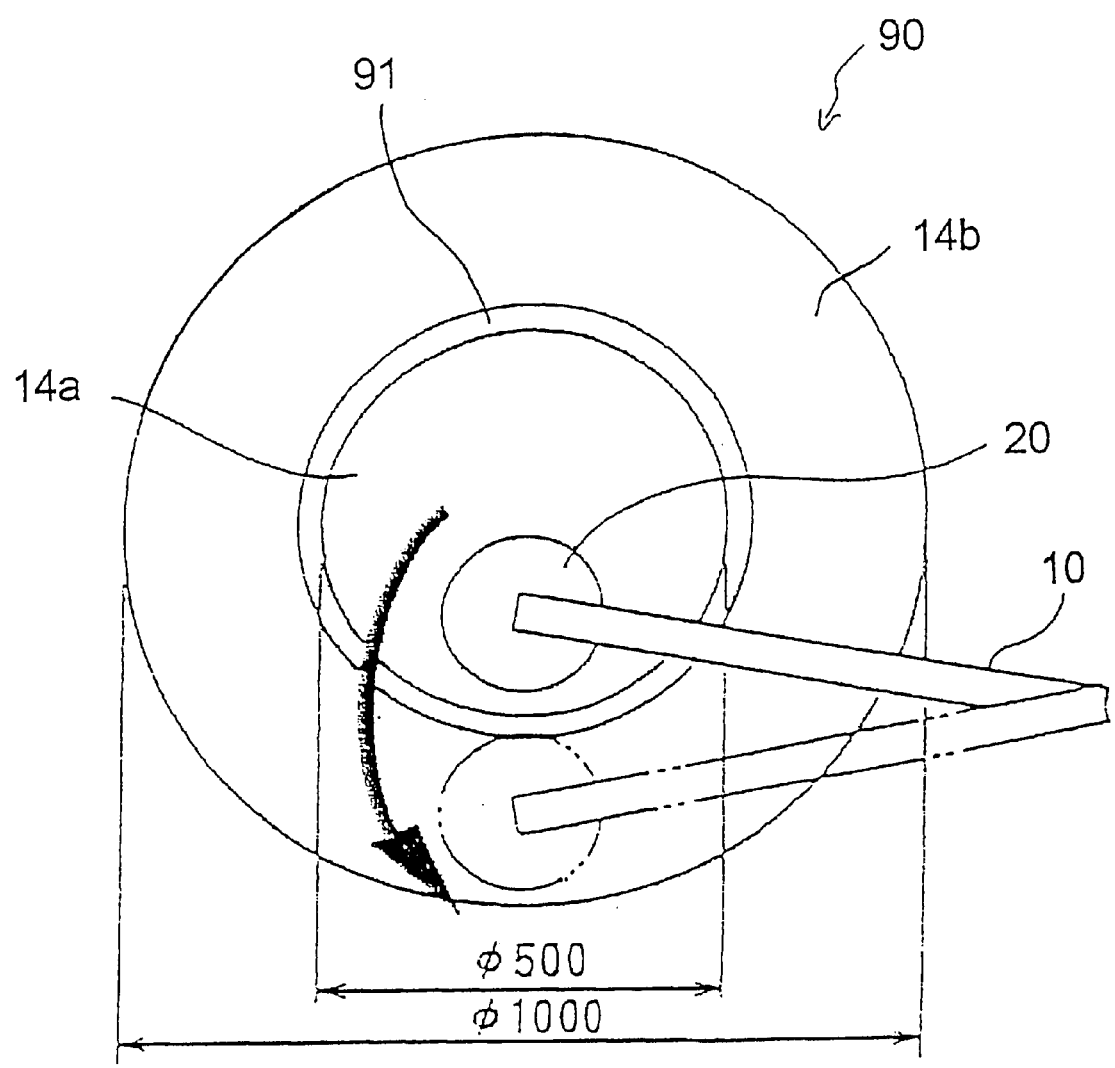
FIG. 20 is a plan view of another embodiment of the polishing apparatus according to the present invention.

FIG. 20 shows another embodiment of the polishing apparatus 90, which comprises a turntable having a first fixed abrasive polishing tool 14a at the inner area of the turntable and a second fixed abrasive polishing tool 14b at the outer area. Since the second fixed abrasive polishing tool 14b is located at the outer area, the radius vector therefor is larger than the first fixed abrasive polishing tool so that relative speed is higher for the second fixed abrasive polishing tool 14b. This is advantageous for obtaining a scratchless surface. Also, an annular groove 91 formed between the first and second polishing tools 14a, 14b serves to prevent different polishing solutions from mutually mixing, thereby maintaining respective working properties. thereby maintaining respective working properties.

FIG. 21 shows the arrangement of the component units in the polishing apparatus of another embodiment of the present invention. As shown in FIG. 21, at one end of a rectangular shaped floor space, there is a loading/unloading unit 221 for delivery of semiconductor wafers, which are to be polished or already polished, to and from the polishing apparatus. At the opposite end of the floor space, there are two main polishing units 230a, 230b. A transfer line extends between the loading/unloading unit 221 and main polishing units 230a, 230b, and two robotic transfer devices 222a, 222b are provided along the transfer line in this embodiment.

At one side of the transfer line, there is a wafer inverter 225 for turning over the semiconductor wafer, and on the opposite side, there are disposed a finish polishing unit 230c and three cleaning machines 223a, 223b and 223c. The cleaning machines 223a, 223b and 223c include a rinsing machine or a scrubbing machine using a brush or sponge.

The main polishing units 230a, 230b and the finish polishing unit 230c are basically of the same construction and are respectively provided with a translation table section which provides a circulative translation motion to the abrading surface of a polishing tool, and a top ring for holding the workpiece 20 and pressing it onto the polishing tool surface with a given pressure.

The main polishing units 230a, 230b and the finish polishing unit 230c are basically of the same construction as the ones shown in FIGS. 15 and 16. That is, an abrading plate 159 is attached on the upper surface of the surface plate 137 of the main polishing units 230a, 230b, and a polishing cloth 159a is attached on the upper surface of the surface plate 137 of the finish polishing unit 230c. Though the abrading plate 159 is directly attached on the surface plate 137 in this embodiment, it is possible to adapt a fixing Method using cartridge type abrading tools as described above. This abrading plate 159 and polishing cloth 159a are also provided with a plurality of discharge holes 158 to correspond with the liquid holes 157. The liquid holes 157, and the discharge holes 158 are generally uniformly distributed across the entire surfaces of the surface plate 137, the abrading plate 159 and the polishing cloth 159a.

The abrading plate 159 is a circular disc made of a resin serving as a binder for abrasive particles of less than several micrometers (for example, $CeO_2$). To assure that the abrading surface is flat, the material and manufacturing process are selected so that the abrading plate would not show bowing and deformation during manufacturing and storage. The surface of the abrading plate 159 is provided with channels made of grooves, shaped in a lattice, spiral or radiating pattern (not shown) to distribute the polishing solution and to remove polishing debris. The discharge holes 158 are aligned with the channels. The particle size of the abrasive particles included in the polishing solution is chosen so that the size is relatively large for the rough polishing units 230a, 230b, but is relatively small in the finish polishing unit 230c.

The top ring is constructed in the same manner as the one shown in FIG. 15.

The operation of the polishing facility of such a construction will be explained in the following. The wafer (workpiece) 20 in the wafer storage cassette is transferred by the transfer robots 222a, 222b through the wafer inverter 225, as necessary, to be attached to one of the top rings 132 in the main polishing unit 230a or 230b. The wafer is roughly polished in the main polishing unit 230a or 230b. The roughly polished wafer is transferred by the robots 222a, 222b to the cleaning section 223a to be washed and finish polished in the finish polishing unit 230c.

Details of polishing action will be explained further. The surface plate 137 undergoes a circulative translation motion (scroll motion) by the action of the driving motor, and the wafer 20 attached to the top ring 132 is pressed against the surface of the abrading plate 159 bonded to the surface plate 137. Polishing solution is supplied through the liquid holes 157, discharge holes 158 and the channels on the abrading plate 159 to reach the work surface of the wafer 20.

The action of the minute circulative translation motion (of motion radius "e") between the wafer 20 and the rubbing surface of the abrading plate 159 produces a uniform polish on the entire work surface of the wafer 20. When the wafer 20 is processed by positioning the wafer 20 and the abrading plate 159 at a constant relationship, it causes some problems introduced by localized differences in the surface conditions of the abrading plate 159. To avoid such problems, the top ring 132 is rotated slowly so as to change positioning of the wafer 20 relative to the abrading plate 159. Thus, the surface of the semiconductor wafer is continuously polished at different locations of the abrading plate 159 further uniformly. Finish polishing is basically the same process as rough polishing. Here, in the main polishing process, polishing conditions are such that wafer 20 and the polishing tool (abrading plate) 159 are moved at a relatively fast speed, and that the pressing force is relatively high and polishing solution includes relatively coarse abrasive particles to produce a given amount of material removal.

On the other hand, the purpose of the finish polishing process is, in addition to producing further leveling and smoothing of the work surface, to remove any adhered micro-particles from the wafer surface. Therefore, roughness of the work surface of the polishing tool (cloth) 159a is finer, and the relative motion speed and pressing force between the polishing tool and the wafer are made lower than those in the main polishing process. The polishing solution is usually purified water, but occasionally a solution or slurry may be used when necessary. When using a slurry, use of polishing particles of the same material as the abrading plate in the slurry produces good results in some cases.

Wafer 20 after the finish polishing process is subjected to one or several cleaning and drying steps in the cleaning machines 223a–223c, and is stored in the wafer cassette. In this polishing facility, two main polishing units 230a, 230b are provided to perform the main polishing process while one finish polishing unit 230c is provided. This arrangement is chosen because of the consideration than that the duration of the main polishing process is longer than that of the finish polishing process, so that, one of the two units can operate for the other's downtime to increase the operational efficiency.

In this polishing facility, because the polishing process is carried out in two stages in parallel, particle size and solution outlet openings 157, 158 can be chosen to suit the nature of each polishing process, therefore, the duration of each polishing process is shortened. Accordingly, the overall throughput (work done) is significantly improved compared with the conventional polishing apparatus.

Also, because the polishing units 230a~230c are moved in a circulative translation motion, the size of the surface plate 137 only needs to be larger than the wafer 20 by an amount of eccentricity "e". Therefore, compared with the conventional polishing unit 10, the installation space is reduced significantly. Additionally, it is easier to design a combined layout of units such as cleaning machines and wafer inverters as well as to modify an existing layout. Furthermore, the surface plate 137 undergoes a circulative translation motion in the polishing units 230a~230c, the surface plate 137 is supported at several locations distributed along its peripheral edge, and contributes to improved flatness of the polished wafer compared with the conventional polishing apparatus based on a high speed turntable.

In the facility shown in FIG. 21, although a polishing cloth is used in the second polishing process, it is permissible to use an abrading plate in the second polishing process. In this case, abrasive particles in the abrading plate used in the second polishing process should be finer than the that used in the first polishing process.

In the following, some of the typical operating parameters in the first and second polishing steps are compared.

1. First Polishing Step (Rough Polishing)

| | |
|---|---|
| Polishing solution | Depends on material to be polished |
| Abrasive particles | $CeO_2$ |
| material of abrading plate | |
| Particle size | 0.1~10 mm |
| Pressing pressure | 200~500 g/cm$^2$ (1960~4900 mN/cm$^2$) |
| Relative speed | 0.07~0.6 m/sec |
| Polishing duration | Depends on removal rate |

Second Polishing Step (finish polishing)

| | |
|---|---|
| Polishing solution | water, chemicals, slurry |
| Polishing cloth | soft cloth (non-woven cloth, nap lamination) |
| Pressing pressure | 0~200 g/cm$^2$ (1~1960 mN/cm$^2$) |
| Relative speed | 0.07~0.6 m/sec |
| Polishing duration | 10~120 sec |

In the above embodiment, the polishing tool is described as an "abrading plate", which is used to cover the same scope as "fixed abrasive polishing tool". The above embodiments were presented only for explanation, and should not be construed to limit the scope of the invention. Various changes and modifications may be made without departing from the scope of the appended claims.

In summary, the present invention can establish, by using different types of fixed abrasive polishing methods, a superior quality polishing with a high flatness and less scratch creation on the wafer surface while maintaining inherent advantages for environmental and cost problems.

What is claimed is:

1. A method for polishing a surface of a semiconductor device wafer, comprising:

first polishing a surface of a semiconductor device wafer by performing a first fixed abrasive polishing operation; and finish polishing the polished surface of said semiconductor device wafer as a final polishing operation to remove scratches from the polished surface, by performing a second fixed abrasive polishing operation that is different from said first fixed abrasive polishing operation.

2. The method according to claim 1, wherein said second fixed abrasive polishing operation uses a second fixed abrasive polishing tool that is different from a first fixed abrasive polishing tool used in said first fixed abrasive polishing operation.

3. The method according to claim 2, wherein said second fixed abrasive polishing tool is softer than said first fixed abrasive polishing tool.

4. The method according to claim 3, wherein said second fixed abrasive polishing tool has a lower elastic modulus than that of said first fixed abrasive polishing tool.

5. The method according to claim 2, wherein said second fixed abrasive polishing tool comprises second abrasive particles having a lower hardness than that of first abrasive particles in said first fixed abrasive polishing tool.

6. The method according to claim 2, wherein said second fixed abrasive polishing tool has a higher abrasive particle self-generation ability than that of said first fixed abrasive polishing tool.

7. The method according to claim 2, wherein said second fixed abrasive polishing tool comprises a higher porosity than that of said first fixed abrasive polishing tool.

8. The method according to claim 2, wherein said second fixed abrasive polishing tool has a lower binder ratio than that of said first fixed abrasive polishing tool.

9. The method according to claim 2, wherein said second fixed abrasive polishing tool comprises a water soluble binder.

10. The method according to claim 2, wherein said second fixed abrasive polishing tool comprises second abrasive particles having a smaller diameter than that of first abrasive particles in said first fixed abrasive polishing tool.

11. The method according to claim 2, wherein said second fixed abrasive polishing tool comprises elastic microparticles embedded in a binder.

12. The method according to claim 2, wherein said second fixed abrasive polishing tool comprises a laminated configuration including an upper hard tool layer and a lower elastic layer.

13. The method according to claim 1, wherein said second fixed abrasive polishing operation is performed in a second condition that is different from a first condition in which said first fixed abrasive polishing operation is performed.

14. The method according to claim 13, wherein said second fixed abrasive polishing operation uses a second polishing solution that is different from a first polishing solution used in said first fixed abrasive polishing operation.

15. The method according to claim 1, further comprising dressing a polishing tool while said polishing tool is being used in said first fixed abrasive polishing operation and/or said second fixed abrasive polishing operation.

16. The method according to claim 1, further comprising cleaning said semiconductor device wafer between said first fixed abrasive polishing operation and said second fixed abrasive polishing operation.

17. The method according to claim 1, wherein said first fixed abrasive polishing operation and said second fixed abrasive polishing operation are performed by using the same fixed abrasive polishing tool during different polishing conditions.

18. The method according to claim 1, wherein said first fixed abrasive polishing operation and said second fixed abrasive polishing operation are performed by using the same fixed abrasive polishing tool and different polishing solutions.

19. The method according to claim 1, wherein said first fixed abrasive polishing operation and said second fixed abrasive polishing operation are performed by using the same fixed abrasive polishing tool, and further comprising dressing said fixed abrasive polishing tool concurrently with performance of a respective one of said first fixed abrasive polishing operation and said second fixed abrasive polishing operation.

20. The method according to claim 1, wherein said first fixed abrasive polishing operation and said second fixed abrasive polishing operation are performed by using the same fixed abrasive polishing tool, and further comprising cleaning said semiconductor device wafer between said first fixed abrasive polishing operating and said second fixed abrasive polishing operation.

21. The method according to claim 1, wherein said first fixed abrasive polishing operation and said second fixed abrasive polishing operation are performed by using the same fixed abrasive polishing tool, and further comprising cleaning or dressing said fixed abrasive polishing tool between said first fixed abrasive polishing operation and said second fixed abrasive polishing operation.

22. A method for polishing a surface of a semiconductor device wafer, comprising:

first polishing a surface of a semiconductor device wafer with a first polishing tool; and finish polishing the polished surface of said semiconductor device wafer, in order to remove substantially all scratches remaining on the polished surface of said semiconductor device wafer, with a fixed abrasive polishing tool.

23. A method for polishing a surface of a semiconductor device wafer, comprising:

first polishing a surface of a semiconductor device wafer with a first fixed abrasive; and finish polishing the polished surface of said semiconductor device wafer as a final polishing operation to remove scratches from the polished surface, with a second fixed abrasive is different from said first fixed abrasive.

24. A method for polishing a surface of a semiconductor device wafer, comprising:

first polishing a surface of a semiconductor device wafer with a first polishing tool; and finish polishing the polished surface of said semiconductor device wafer as a final polishing operation, in order to substantially remove any scratches remaining on the polished surface of said semiconductor device wafer, with a fixed abrasive polishing tool.

\* \* \* \* \*

UNITED STATES PATENT AND TRADEMARK OFFICE
CERTIFICATE OF CORRECTION

PATENT NO.    : 6,595,831 B1
DATED         : July 22, 2003
INVENTOR(S)   : Kazuto Hirokawa et al.

It is certified that error appears in the above-identified patent and that said Letters Patent is hereby corrected as shown below:

Column 30,
Line 30, change "operating" to -- operation --.

Signed and Sealed this

Twenty-fifth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,595,831 B1  
DATED : July 22, 2003  
INVENTOR(S) : Kazuto Hirokawa et al.

Page 1 of 1

It is certified that error appears in the above-identified patent and that said Letters Patent is hereby corrected as shown below:

Title page,  
Item [63], Related U.S. Application Data, change "Continuation-in-part of application No. 09/301,718, filed on April 29, 1999, now Pat. No. 6,413,156." to --Continuation-in-part of application No. 09/301,718, filed on Apr. 29, 1999, now Pat. No. 6,413,156, which is a Continuation-in-part of application No. 08/857,252, filed on May 16, 1997, now Pat. No. 5,989,107, and a Continuation-in-part of application No. 08/972,012, filed on Nov. 17, 1997, now abandoned, and a Continuation-in-part of application No. PCT/JP98/05253, filed on Nov. 20, 1998.--.

Item [30], Foreign Application Priority Data, please add the following:  
-- May 16, 1996 (JP).....8-146776  
   Nov. 15, 1996 (JP).....8-321141  
   Nov. 21, 1997 (JP).....9-338032 --.

Column 1,  
Line 3, change "continuation-in-part of application No. 09/301,718, filed on Apr. 29, 1999, now Pat. No. 6,413,156." to --continuation-in-part of application No. 09/301,718, filed on Apr. 29, 1999, now Pat. No. 6,413,156, which is a continuation-in-part of application No. 08/857,252, filed on May 16, 1997, now Pat. No. 5,989,107, and a continuation-in-part of application No. 08/972,012, filed on Nov. 17, 1997, now abandoned, and a continuation-in-part of application No. PCT/JP98/05253, filed on Nov. 20, 1998.--.

Column 28,  
Line 52, change "mm" to -- $\mu$m --.

Signed and Sealed this

Twenty-third Day of November, 2004

JON W. DUDAS  
*Director of the United States Patent and Trademark Office*